United States Patent [19]
Sato

[11] Patent Number: 6,072,196
[45] Date of Patent: Jun. 6, 2000

[54] SEMICONDUCTOR LIGHT EMITTING DEVICES

[75] Inventor: Shunichi Sato, Miyagi-ken, Japan

[73] Assignee: Ricoh Company, Ltd., Tokyo, Japan

[21] Appl. No.: 08/923,348

[22] Filed: Sep. 4, 1997

[30] Foreign Application Priority Data

Sep. 5, 1996 [JP] Japan ..................... 8-25421

[51] Int. Cl.$^7$ ............................. H01L 33/00
[52] U.S. Cl. ............................. 257/87; 257/76; 257/103; 257/96; 257/97; 257/13; 372/44; 372/45
[58] Field of Search ............................. 257/76, 103, 87, 257/96–97, 13; 372/44–45

[56] References Cited

U.S. PATENT DOCUMENTS

| | | | |
|---|---|---|---|
| 3,931,631 | 1/1976 | Groves et al. | 257/87 |
| 5,274,251 | 12/1993 | Ota et al. | 257/78 |
| 5,331,656 | 7/1994 | Tanaka | 372/45 |
| 5,442,201 | 8/1995 | Adomi et al. | 257/86 |
| 5,586,136 | 12/1996 | Honda et al. | 372/45 |

FOREIGN PATENT DOCUMENTS

| | | |
|---|---|---|
| 04114486 | 4/1992 | Japan . |
| 05041560 | 2/1993 | Japan . |
| 06037355 | 2/1994 | Japan . |
| 06053602 | 2/1994 | Japan . |
| 06077592 | 3/1994 | Japan . |
| 06334168 | 12/1994 | Japan . |
| 07007223 | 1/1995 | Japan . |
| 8-307005 | 11/1996 | Japan . |

OTHER PUBLICATIONS

J.W. Matthews, et al., "Defects in Epitaxial Multilayers," Jour. of Crystal Growth, vol. 27, pp. 118–125, 1974.
Hamada et al., Electronics Letter, vol. 28, No. 19 Sep. 1992, pp. 1834–1836.
Tiwari et al., Applied Physics Letter, vol. 60 Feb. 1992, pp. 630–632.
Kondow et al., Japanese Journal Applied Physics, vol. 65(2), 1996, pp. 148–151.
Kishi et al., Technical Digest of Annual Meeting of Institute of Electronics, Information and Communication Engineers, GC–1, p. 437 of Part 4, Mar. 1991.

*Primary Examiner*—John Guay
*Attorney, Agent, or Firm*—Cooper & Dunham LLP

[57] ABSTRACT

Nitrogen-containing III–V alloy semiconductor materials have both a conduction band offset $\Delta Ec$ and a valence band offset $\Delta Ev$ large enough for the practical applications to light emitting devices. The semiconductor materials are capable of providing laser diodes, having excellent temperature characteristics with emission wavelengths in the red spectral region and of 600 nm or smaller, and high brightness light emitting diodes with emission wavelengths in the visible spectral region. The light emitting device is fabricated on an n-GaAs substrate, which has the direction normal to the substrate surface is misoriented by 15° from the direction normal to the (100) plane toward the [011] direction. On the substrate, there disposed by MOCVD, for example, are an n-GaAs buffer layer, an n-$(Al_{0.7}Ga_{0.3})_{0.51}In_{0.49}P$ cladding layer, an $(Al_{0.2}Ga_{0.8})_{0.49}In_{0.51}N_{0.01}P_{0.99}$ active layer, a p-$(Al_{0.7}Ga_{0.3})_{0.51}In_{0.49}P$ cladding layer, and a p-GaAs contact layer.

21 Claims, 13 Drawing Sheets

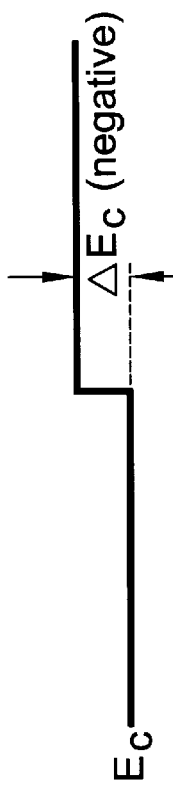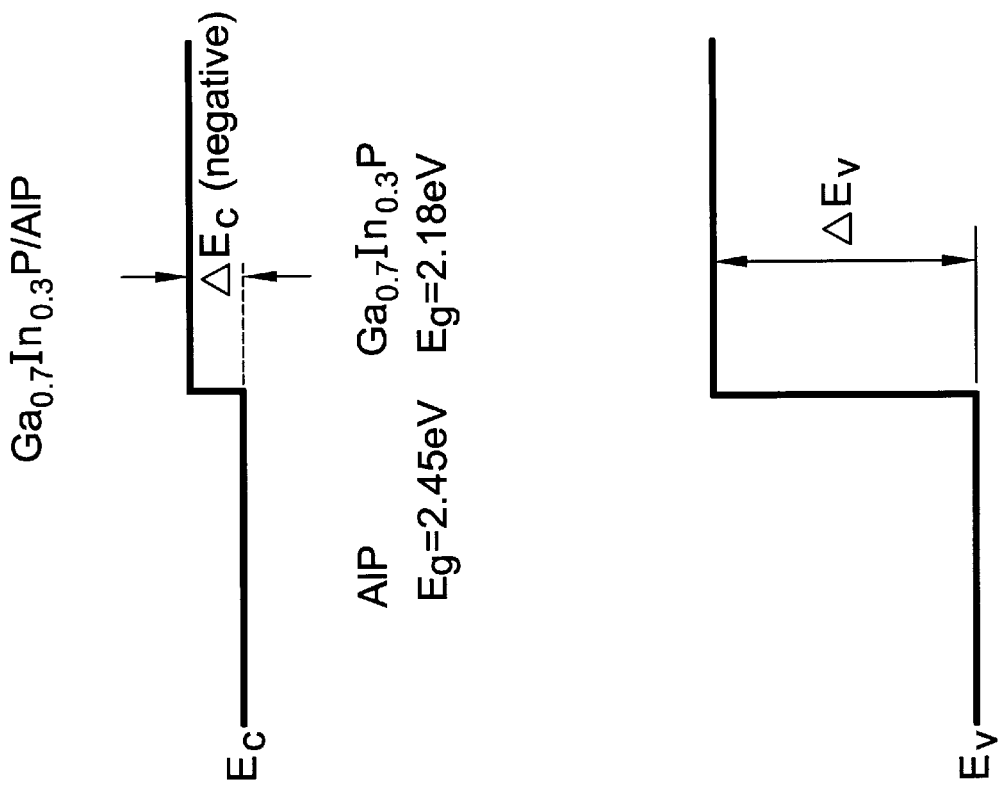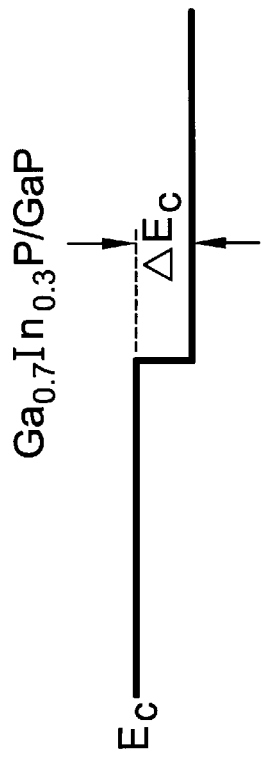
FIG. 1a Prior Art
FIG. 1b

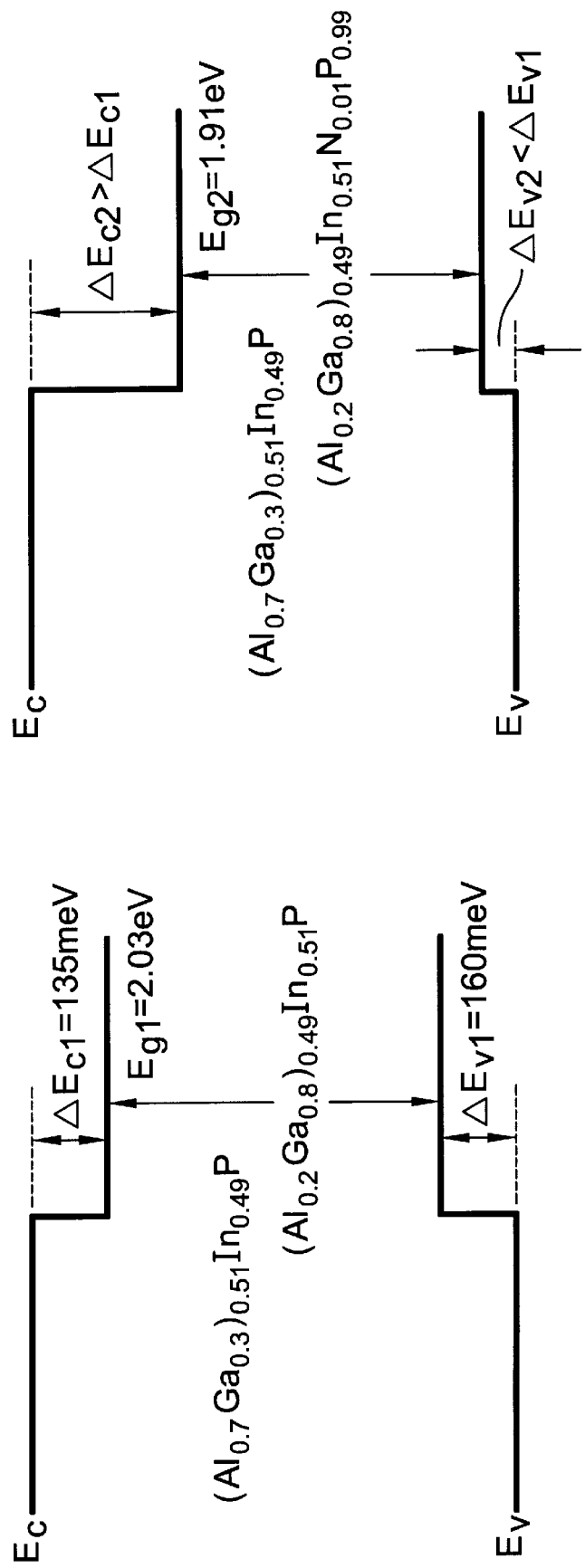
FIG. 5b WITH NITROGEN ADDITION
FIG. 5a WITHOUT NITROGEN ADDITION

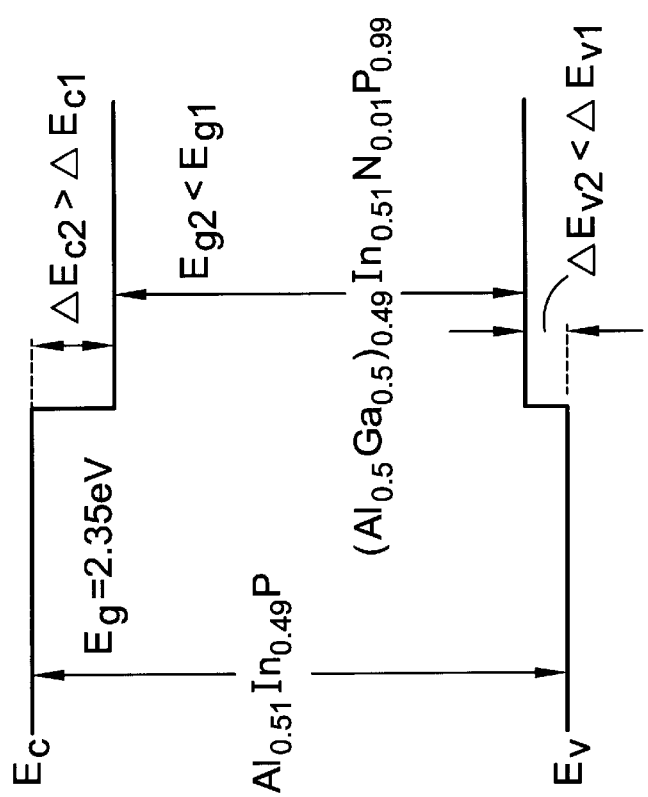
FIG. 8b WITH NITROGEN ADDITION
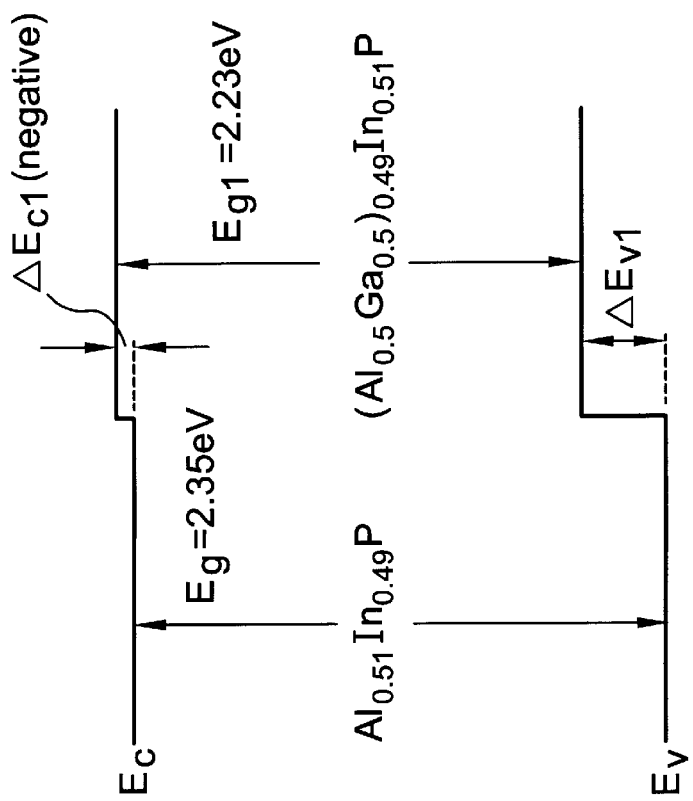
FIG. 8a WITHOUT NITROGEN ADDITION

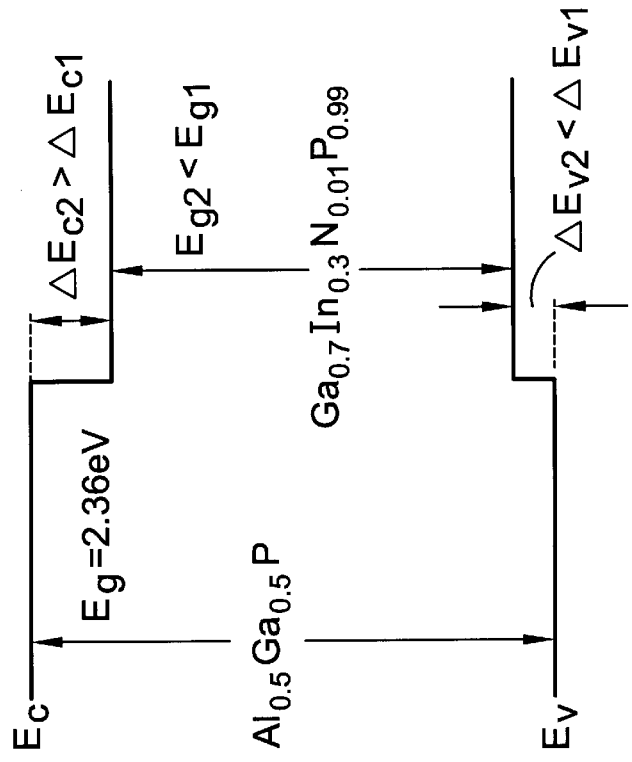
FIG. 11b WITH NITROGEN ADDITION
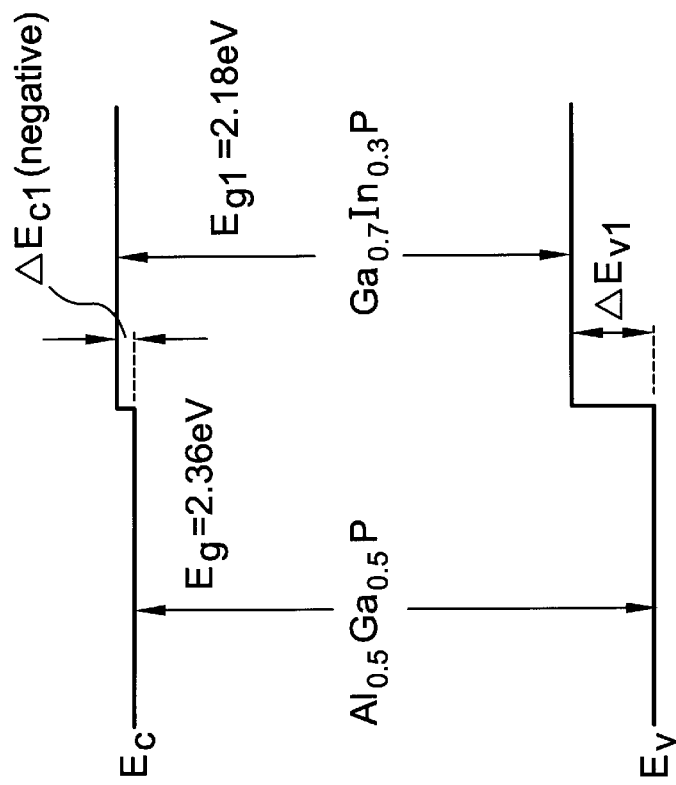
FIG. 11a WITHOUT NITROGEN ADDITION

SEMICONDUCTOR LIGHT EMITTING DEVICES

BACKGROUND OF THE INVENTION

1. Field of the Invention

This invention relates in general to semiconductor devices and more particularly, to semiconductor light emitting devices such as light emitting diodes for use in color displays, and laser diodes for optical recording and printing systems.

2. Description of the Related Art

Compound semiconductors in general and AlGaInP semiconductor materials in particular have recently received considerable attention as a group of new semiconductor materials for use in high brightness light sources such as, for example, light emitting diodes for color displays, having emission wavelengths ranging from green to red, and semiconductor laser diodes in the visible wavelength region for optical recording and printing systems.

The AlGaInP semiconductor materials have a largest band gap energy among the direct transition III–V alloy semiconductors which is lattice-matched to GaAs. The maximum band gap energy reaches about 2.3 eV, which corresponds to 540 nm in wavelength.

When a heterojunction with AlGaInP material is formed, however, a relatively small conduction band discontinuity ($\Delta Ec$) results between an active layer (or light emitting layer) and a cladding layer which has a band gap energy larger than that of the active layer. This small band offset causes injected carriers (electrons, in this case) to overflow with relative ease from the active layer to the cladding layer, resulting in disadvantages such as, for example, a large variation of laser threshold current density with temperature, or unsatisfactory temperature characteristics of the light emitting devices fabricated with the materials.

To achieve a satisfactory carrier confinement, and thereby overcome the above-mentioned difficulty, a structure has been disclosed in Japanese Laid-Open Patent Application No. 4-114486/1992, in which a quantum barrier structure is formed between an active layer and a cladding layer.

To fabricate a semiconductor laser, it is necessary to have a structure such that the confinement of carriers and emitted light into an active layer is carried out by a cladding layer, which has a band gap energy large enough for the confinement.

However, because of the small band offset of the conduction band mentioned above, the magnitude of a band gap energy of the active layer material is somewhat limited, and a material with too large a band gap energy can not be used for the active layer in conventional doublehetero (DH) structures composed of conventional bulk materials.

In addition, although the addition of Al in AlGaInP semiconductor materials is generally known to result in large band gap energies, a smaller amount of Al addition is preferred because of the highly reactive nature of Al, which reacts even with an even minute amount of oxygen in source materials and/or ambient atmosphere during layer growths. This may form deep level impurities and decrease the light emission efficiency.

Several semiconductor laser diodes have been reported, consisting of GaAs substrates and AlGaInP active layers which are lattice-matched to GaAs substrates.

For example, a laser diode comprises an $(Al_{0.19}Ga_{0.81})_{0.51}In_{0.49}P$ active layer and has an emission wavelength of as short as 632.7 nm continuous at room temperature. To further decrease the emission wavelengths and threshold current densities, a quantum well structure is disclosed in Japanese Laid-Open Patent Application No. 6-77592/1994, consisting strained quantum well layers used as an active layer.

As another example, a laser diode is described by Hamada et al. in Electronics Letter, Vol. 28, No. 19 (1992), pages 1834–36. As disclosed therein, the laser diode consists of compressively strained $(Al_{0.08}Ga_{0.92})_{0.45}In_{0.55}P$ multiquantum wells (MQW) as active layers incorporating multiquantum barriers (MQB), and has a continuous laser emission at 615 nm at room temperature. However, temperature characteristics of the laser diode is not satisfactory for practical use.

As above-mentioned, laser diodes consisting of conventional materials which are lattice-matched to GaAs substrate, have shortcomings such as difficulties in decreasing emission wavelengths and unsatisfactory temperature characteristics, thus being incapable of having laser emission wavelengths at about 600 nm and less.

As still another example, a laser diode is described in Japanese Laid-Open Patent Application No. 6-53602/1994, which consists of a GaP substrate, an $Al_yGa_{1-y}P$ ($0 \leq y \leq 1$) cladding layer, and a $Ga_xIn_{1-x}P$ ($0<x<1$) direct transition MQW active layer doped with nitrogen as isoelectronic trap impurities, incorporating $Ga_xIn_{1-x}P$ ($0<x<1$) barrier layer. This laser diode has an emission wavelength as small as about 600 nm.

Also disclosed in Japanese Laid-Open Patent Application No. 5-41560/1993 is a laser diode which consists of a GaAs substrate, a double-hetero (DH) structure of $(AlGa)_aIn_{1-a}P$ ($0.51<a \leq 0.73$) layers formed on the substrate, and further provided with a $GaAs_xP_{1-x}$ buffer layer disposed on the substrate and under the DH structure, to relax a lattice-mismatch caused in the region between the GaAs substrate and the DH structure.

Although these structures have advantages such as, being fabricated with materials of fewer aluminum contents and still capable of attaining short laser wavelengths, they also have shortcomings, such as difficulties in confining enough carries in active layers.

FIGS. 1a and 1b represent energy band alignments for devices fabricated on GaP substrates which are described in Japanese Laid-Open Patent Application No. 6-53602/1994. For constructing the band alignments, a reference was made to the description by Tiwari et al. in Applied Physics Letter Vol. 60 (1992), pages 630–32.

Referring to FIG. 1a a device consists of a GaP substrate, a GaP cladding layer, and a $Ga_{0.7}In_{0.3}P$ active layer. From the above-mentioned band alignment, a conduction band offset ($\Delta Ec$) is expected to be about 100 meV and a valence band offset ($\Delta Ev$) is about 0 meV, in this construction.

In FIG. 1b there are shown a cladding layer composed of AlP, and an active layer of $Ga_{0.7}In_{0.3}P$ disposed on a GaP substrate. In this construction, a valence band offset $\Delta Ev$ is about 470 meV, and a conduction band energy of $Ga_{0.7}In_{0.3}P$ is higher than that of the AlP cladding layer by about 190 meV, in contrast to the structure of FIG. 1a.

When a cladding layer is disposed using a GaP-AlP alloy, a heterojunction may be formed, which may have an energy band offset of a magnitude large enough to confine both electron and hole carriers, based on the above-mentioned consideration of the band alignment. In practice, however, $\Delta Ec$ for this system is less than 100 meV, which is not large enough to achieve an electron confinement sufficient for the practical device application.

Although it is known that ΔEc increases by adding Al in place of Ga and In, the magnitude of the increase in ΔEc is minimal. In addition, a lattice-mismatch between the AlGaInP active layer and the GaP substrate increases further from the present value of 2.3%. This increase of the lattice-mismatch effectively decreases the critical thickness, thereby requiring a smaller layer thickness during fabrication.

Since the critical thickness is defined as the minimum thickness to obviate occurrence of misfit dislocations caused by the lattice mismatch, the above-mentioned increase is not preferable to the practical application.

The present argument on the band offsets and critical thickness is also true for the aforementioned $(AlGa)_aIn_{1-a}P$ device described in Japanese Laid-Open Patent Application No. 5-41560/1993.

The above stated structures therefore have advantages such as, being fabricated without aluminum and still capable of attaining shorter laser emission wavelengths. However, no heterojunction has been found to have both ΔEc and ΔEv band offsets large enough for the practical application, such as ΔEc of about 190 meV or higher, and ΔEv of about 60 meV or higher.

Furthermore, to fabricate a laser diode on a silicon or GaP substrate, nitrogen-containing III–V alloy semiconductors such as InNSb and AlNSb, are disclosed in Japanese Laid-Open Patent Application No. 7-7223/1995. In that disclosure, the band gap energies of these two semiconductors, InNSb and AlNSb, are estimated by linearly interpolating band gap energies of InN and InSb, and AlN and AlSb, respectively, to find that $AlN_xSb_{1-x}$ with x=0.4 is lattice-matched to GaAs, and that has a band gap energy of about 4.0 eV.

If the alloy semiconductor mentioned just above is feasible, light emitting devices may be fabricated, which have emission wavelengths ranging to the ultraviolet spectral region. However, since almost all of these nitrogen-containing alloy semiconductors are in the non-miscible region in the solid solubility diagram, they are not feasible by conventional crystal growth methods but only by non-equilibrium growth methods such as, for example, metal organic chemical vapor deposition (MOCVD) and molecular beam epitaxy (MBE).

Even by MOCVD and MBE, the nitrogen content has not been able to exceed 10%, and a content of about 40% preferable to the device application is quite difficult to achieve. In addition, as described in the aforementioned Japanese Laid-Open Patent Application No. 6-334168/1994, a relatively large degree of energy level bowing is present due to a large electronegativity of nitrogen. Therefore, their band gap energies decrease by adding more nitrogen into InSb or AlSb, and at the alloy composition for which the lattice-matching to GaAs or Si is achieved, its band gap energy is smaller than those of InSb or AlSb, which is in contrast to the above-mentioned expectation.

Accordingly, it is difficult to form an alloy semiconductor such as described in Japanese Laid-Open Patent Application No. 6-37355/1994. Namely, by the use of the energy band bowing, a light emitting device with 1.5 micron emissions may be achieved with a GaInNAs material formed on a GaAs substrate. However, light emitting devices of shorter wavelengths can not be achieved by these structures.

SUMMARY OF THE INVENTION

It is therefore an object of the present invention to provide semiconductor light emitting devices which overcome the above-noted difficulties.

Another object of the invention is to provide nitrogen-containing III–V alloy semiconductor materials which have both a conduction band offset ΔEc and a valence band offset ΔEv large enough for the practical applications to light emitting devices.

It is yet another object of the invention is to provide light emitting devices using the semiconductor materials, such as laser diodes which have excellent temperature characteristics with emission wavelengths of the red spectral range and of 600 nm or shorter, and high brightness light emitting diodes in the visible spectral region.

According to an embodiment of the invention, there is provided a semiconductor light emitting device which has at least one active layer of a nitrogen-containing III–V alloy semiconductor formed on a semiconductor substrate. The active layer has the formula $(Al_xGa_{1-x})_yIn_{1-y}N_zP_{1-z}$ ($0 \leq x \leq 1, 0 \leq y \leq 1, 0 < z < 1$), and a nitrogen concentration of the active layer of the nitrogen-containing III–V alloy semiconductor is equal to or more than about $3 \times 10^{19}$ cm$^{-3}$.

According to an alternative embodiment of the invention, the active layer of the nitrogen-containing III–V alloy semiconductor is grown by adding nitrogen to an indirect transition semiconductor having the formula $(Al_xGa_{1-x})_yIn_{1-y}P_{1-z}$ ($0 \leq x \leq 1, 0 \leq y \leq 1$).

The active layer of the nitrogen-containing III–V alloy semiconductor may be disposed epitaxially by MOCVD method using a nitrogen containing organic compound as a source material for nitrogen, and the nitrogen containing organic compound is selected from the group consisting of dimethylhydrazine and tertiary butyl amine.

The thickness of the active layer is less than the critical thickness, enough to obviate the occurrence of misfit dislocations. In addition, the active layer is added with n-type or p-type of dopants, which are selected from the group consisting of silicon, selenium or sulfur for n-type dopants; and zinc, carbon, magnesium or beryllium for p-type dopants.

The semiconductor substrate is composed of GaAs or GaP, individually or in the form of alloy thereof, and is formed such that the direction normal to the surface of the substrate is misoriented from the direction normal to the (100) plane toward the [011] direction by an angle of from −54.7° to 54.7°, or toward the [0−1 1] direction by an angle of from −54.7° to −10° or from 10° to 54.7°.

According to still another embodiment of the invention, the semiconductor light emitting device which has at least one active layer of the nitrogen-containing III–V alloy semiconductor formed on a semiconductor substrate, is further provided, where relevant, with a cladding layer, a light guide layer, and/or a buffer layer.

Nitrogen-containing III–V alloy semiconductor materials of the present invention have both a conduction band offset ΔEc and a valence band offset ΔEv large enough for the applications to light emitting devices. By the use of the semiconductor materials, there are provided laser diodes having an excellent temperature characteristics with emission wavelengths in the red spectral region and of 600 nm or shorter, and high brightness light emitting diodes with emission wavelengths in the visible spectral region.

BRIEF DESCRIPTION OF THE DRAWINGS

Preferred embodiments of the invention are described hereinbelow with references to the accompanying drawings wherein like numerals represent like or identical elements, wherein:

FIG. 1a shows an energy band alignment for a conventional light emitting device with a GaP cladding layer, fabricated on a GaP substrate;

FIG. 1b shows an energy band alignment for a conventional light emitting device with an AlP cladding layer, fabricated on an AlP substrate;

FIGS. 5a and 5b show energy band alignments for heterojunctions formed with cladding layers and active layers of the device of FIG. 4;

FIGS. 8a and 8b show energy band alignments for heterojunctions formed with the cladding layers and active layers of the device of FIG. 7;

FIGS. 11a and 11b show energy band alignments for heterojunctions formed with the cladding layers and active layers of the device of FIG. 10;

DESCRIPTION OF THE PREFERRED EMBODIMENTS

In the description which follows, specific embodiments of the invention particularly useful in light emitting device applications are described. It is understood, however, that the invention is not limited to these embodiments. For example, it is appreciated that the methods for preparing the alloy semiconductors and the light emitting device fabrication of the present invention are adaptable to any form of the semiconductor material preparation and light emitting device fabrication. Other embodiments will be apparent to those skilled in the art upon reading the following description.

In one embodiment, the invention provides a semiconductor light emitting device which has at least one active layer of a nitrogen-containing III–V alloy semiconductor formed on a semiconductor substrate. The active layer has the formula $(Al_xGa_{1-x})_yIn_{1-y}N_zP_{1-z}$ ($0 \leq x \leq 1, 0 \leq y \leq 1, 0 < z < 1$). By forming the alloy semiconductor, a light emission of the visible spectral region becomes feasible. In addition, by the addition of nitrogen, its band gap energy as well as its conduction band energy and valence band energies decrease. Therefore, by selecting an appropriate composition, a heterostructure having an arbitrary ratio of band offset may be obtained.

The active layer of the III–V alloy semiconductor of the light emitting device, has a nitrogen concentration of equal to or more than about $3 \times 10^{19}$ cm$^{-3}$ or 0.13%. Below this nitrogen concentration, light emissions by the carrier recombination via isoelectronic traps are dominant. However, at or above the concentration, light emissions by the interband recombination take over, which are utilized for the light emitting devices of the present invention.

Figure 2:
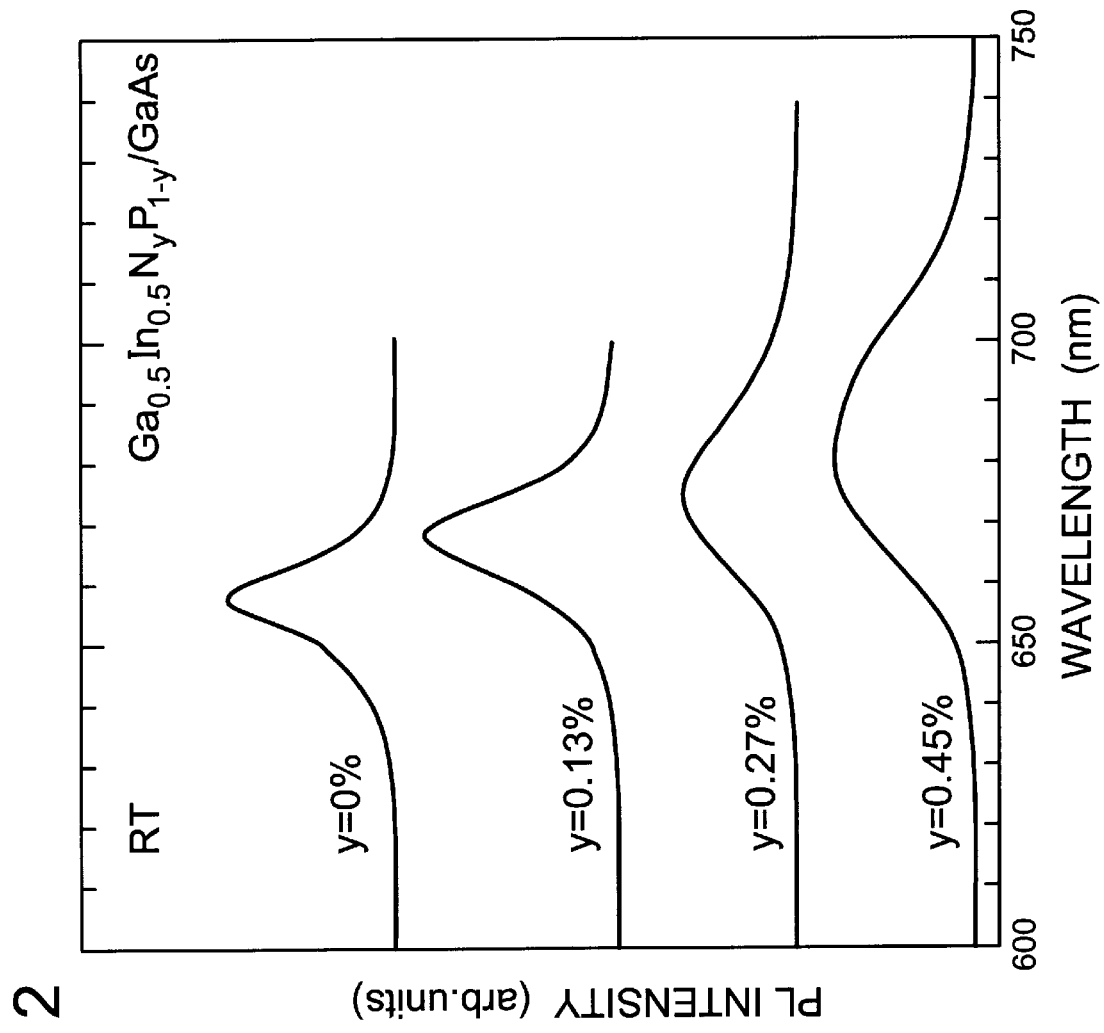
FIG. 2 shows room temperature photoluminescence spectra from $Ga_{0.5}In_{0.5}N_yP_{1-y}$ layers formed on GaAs substrates with various nitrogen concentrations.

The above-mentioned change of light emission process is exemplified by photoluminescence spectra shown in FIG. 2, which are obtained for $Ga_{0.5}In_{0.5}N_yP_{1-y}$ layers formed on GaAs substrates. These spectra indicate an increase in photoluminescence wavelengths or a decrease in a band gap energy with increasing nitrogen concentrations.

In addition, by adding nitrogen of appropriate concentrations, conduction band and valence band energies decrease as well as its band gap energy. Therefore, a heterostructure with an arbitrary ratio of the band offset can be obtained.

The active layer of the present invention is composed of an indirect transition material $(Al_xGa_{1-x})_yIn_{1-y}P$ ($0 \leq x \leq 1$, $0 < y \leq 1$) added with nitrogen.

Since, by nitrogen addition to the above material, the energy differences decrease between X- or L-band of the indirect transition and Γ-band of the direct transition, an increase in the light emitting efficiencies of light emitting diodes can be attained using the material.

Furthermore, if a semiconductor material is an indirect transition semiconductor and its composition is close to the composition of the aforementioned change from indirect to direct transition, the indirect material can be transformed to a direct transition material by adding a small amount of nitrogen addition. Therefore, an indirect transition $(Al_xGa_{1-x})_yIn_{1-y}P$ ($0 \leq x \leq 1$, $0 < y \leq 1$) material changes to a direct transition semiconductor by nitrogen addition, thereby achieving the formation of a direct transition material, having a relative large band gap energy.

The active layer of the present invention may be added with n- or p-type dopants. The dopants are selected from the group consisting of silicon, selenium or sulfur for the n-type, and zinc, carbon, magnesium or beryllium for the p-type dopants.

Since the active layer is doped with n- or p-type dopants, a depletion layer width of the pn junction can be decreased, and a recombination current density can also be decreased, thereby reducing a current component which is ineffective for the light emission.

The semiconductor substrate may be prepared such that the direction normal to the surface of the substrate is misoriented from the direction normal to the (100) plane toward the [011] direction by an angle of from $-54.7°$ to $54.7°$, or toward the [0–1 1] direction by an angle of from $-54.7°$ to $-10°$ or from $10°$ to $54.7°$ Therefore, in the present invention it becomes possible to prevent the natural growth of superlattice structures of overlying layers, thereby avoiding a decrease in the band gap energy of the active layer and thus facilitating light emission of shorter wavelengths.

The above active layer is disposed epitaxially by MOCVD with relative ease, using a nitrogen containing organic compound which has a relatively high dissociation efficiency as a nitrogen source material.

The nitrogen containing organic compound may be selected from the group consisting of dimethylhydrazine (DMHy), $(CH_3)_2NNH_2$ and tertiary butyl amine (TBA), $(CH_3)_3CNH_2$.

The deposition processes using these source materials of the present invention facilitate semiconductor growths with decreased amounts of source gas flows, and enable the switching of gaseous species with more ease. This results in more efficient growths of alloy semiconductors.

The active layer of the III–V alloy semiconductor of the present invention may be disposed on a GaAs substrate. The active layer may not be completely lattice-matched to the GaAs substrate, but of a thickness of less than the critical thickness, enough to obviate the occurrence of misfit dislocations. This results in a wider range of the material selection and processing to achieve an appropriate band alignment of a heterostructure.

The semiconductor light emitting device may further comprise a cladding layer or a light guide composed of $(Al_aGa_{1-a})_bIn_{1-b}P$ ($0 \leq a \leq 1$, $0 < b < 1$) which has a band gap energy larger than, and a refractive index smaller than that of the $(Al_xGa_{1-x})_yIn_{1-y}N_zP_{1-z}$ ($0 \leq x \leq 1, 0 \leq y \leq 1, 0 < z < 1$) active layer, resulting in the confinement of the carriers and emitted light inside the active layer. Namely, by nitrogen addition, its band gap energy as well as conduction band energy and valence band energy decreases. Therefore, by selecting an appropriate composition, a hetero structure having an arbitrary ratio of band offset may be obtained.

Although, in conventional materials without nitrogen addition, the magnitude of a valence band offset is generally larger than that of a conduction band offset, the latter can be increased by nitrogen addition. As a result, for the above-mentioned conventional materials, a larger value for the conduction band offset may be expected, thereby resulting in improved temperature characteristics of light emitting devices.

Therefore, even for an active layer of the present invention, composed of alloy materials such as, for example, $(Al_xGa_{1-x})_yIn_{1-y}N_zP_{1-z}$ ($0 \leq x \leq 1, 0 \leq y \leq 1, 0 < z < 1$), which has a band gap energy larger than that of previous materials, the above-mentioned larger band offsets make laser emission feasible even at room temperatures, possibly at wavelengths of 600 nm or smaller.

The semiconductor light emitting device further comprises a light guide of $(Al_aGa_{1-a})_bIn_{1-b}N_cP_{1-c}$ ($0 \leq a \leq 1$, $0 < b < 1, 0 \leq c < 1$) provided between the substrate and the active layer, and a cladding layer of $(Al_hGa_{1-h})_iIn_{1-i}P$ ($0 \leq h \leq 1, 0 < i < 1$) which is provided on, and lattice-matched to the GaAs substrate.

The light guide may be lattice-matched to, or not completely lattice-matched to the GaAs substrate, but of a thickness of less than the critical thickness. Also, the light guide has a band gap energy larger than that of the active layer, and the cladding layer has a band gap energy larger than that of the light guide. As a result, a light emitting device of the separate confinement heterostructure (SCH) using $(Al_xGa_{1-x})_yIn_{1-y}N_zP_{1-z}$ ($0 \leq x \leq 1, 0 \leq y \leq 1, 0 < z < 1$) as an active layer material, may be fabricated.

In another embodiment of the invention, the semiconductor light emitting device may further comprise a cladding layer of $Al_jIn_{1-j}P$ ($0 < j < 1$) which is lattice-matched to the GaAs substrate or may not be completely lattice-matched to the GaAs substrate, but of a thickness of less than the critical thickness.

Also in this case, by selecting an appropriate composition, a heterostructure having an arbitrary ratio of band offset may be fabricated, because of the following reason:

The material $Al_jIn_{1-j}P$ is an indirect transition semiconductor, which has one of the largest band gap energies and lattice-matches to the Gabs substrate. A heterostructure is now formed with this $Al_jIn_{1-j}P$ material and $(Al_xGa_{1-x})_yIn_{1-y}P$ ($0.45 \leq x \leq 0.7, 0 < y = j < 1$) which is a direct semiconductor, and which is lattice-matched to the GaAs substrate or may not be completely lattice-matched to the GaAs substrate, but of a thickness of less than the critical thickness. In the heterostructure, the conduction band energy of $Al_jIn_{1-j}P$ is smaller than that of the $(Al_xGa_{1-x})_yIn_{1-y}P$ ($0.45 \leq x \leq 0.7, 0 < y = j < 1$). Therefore, with an $Al_jIn_{1-j}P$ cladding layer, carriers are not confined into an $(Al_xGa_{1-x})_yIn_{1-y}P$ active layer, and devices using these layers can not be achieved.

In contrast, by adding nitrogen, the band gap energy as well as conduction band energy and valence band energies, of the active layer decrease. Therefore, by selecting an appropriate composition, a heterostructure having an arbitrary ratio of the band offset may be obtained for the present system.

As a result, it becomes feasible to fabricate a laser diode even using a material such as $(Al_xGa_{1-x})_yIn_{1-y}N_zP_{1-z}$ ($0 \leq x \leq 1, 0 \leq y \leq 1, 0 < z < 1$), which has a band gap energy larger than prior conventional materials. Furthermore, if an active layer is formed with a material of the same band gap energy as the conventional materials, a larger conduction band offset can be expected, thereby resulting in improved temperature characteristics of the devices.

Furthermore, the light emitting device may be fabricated on a GaP substrate, and an active layer formed on the substrate. Since GaP has a smaller lattice constant than that of GaAs, the active layer of $(Al_xGa_{1-x})_yIn_{1-y}N_zP_{1-z}$ ($0 \leq x \leq 1, 0 \leq y \leq 1, 0 < z < 1$) of the present invention may be formed on the substrate with fewer compressive strains in the active layer.

The light emitting device may further comprise a cladding layer or a light guide of $Al_bGa_{1-b}P$ ($0 \leq b \leq 1$). An $(Al_xGa_{1-x})_yIn_{1-y}P$ ($0 \leq x \leq 1, 0 \leq y \leq 1$) active layer material has not previously been found, which has a conduction band energy appreciably smaller, and also a valence band energy appreciably larger than the above-mentioned $Al_bGa_{1-b}P$. By the addition of nitrogen, therefore, its band gap energy as well as conduction band energy and valence band energy decrease, resulting in a heterostructure having an arbitrary ratio of the band offset.

As a result, by selecting a material for the cladding layer or light guide, which has a band gap energy larger than, and a refractive index smaller than the $(Al_xGa_{1-x})_yIn_{1-y}N_zP_{1-x}$ ($0 \leq x \leq 1, 0 \leq y \leq 1, 0 < z < 1$) active layer, the confinement of the carriers and emitted light becomes feasible.

The semiconductor light emitting device may alternatively comprise an $Al_cGa_{1-c}P$ ($0 \leq c < 1$) light guide layer and an $Al_dGa_{1-d}P$ ($c < d \leq 1$) cladding layer.

As a result, a device with a separate confinement heterostructure (SCH) can be fabricated. By this construction, carriers are confined by the $Al_cGa_{1-c}P$ ($0 \leq c < 1$) light guide layer, which has appreciable band offsets for both conduction and valence bands, and emitted light is confined by the $Al_dGa_{1-d}P$ ($c < d \leq 1$) cladding layer, which has a refractive index smaller than that of the active layer.

The semiconductor light emitting device of the present invention may alternatively comprise a GaAs or GaP substrate, a cladding layer, an active layer, and a relaxation buffer layer.

The cladding layer is composed of $(Al_eGa_{1-e})_fIn_{1-f}P$ ($0 \leq e \leq 1$, $0.5 < f \leq 1$) cladding layer and has a lattice constant larger than that of GaP, and smaller than that of GaAs. Since a relaxation buffer layer is provided between the cladding layer and the substrate, it is possible to relax lattice strains even if an $(Al_xGa_{1-x})_yIn_{1-y}N_zP_{1-z}$ ($0 \leq x \leq 1$, $0 \leq y \leq 1$, $0 < z < 1$) active layer, which has a lattice constant larger than that of GaP, and smaller than that of GaAs, is used in the present invention.

The semiconductor light emitting device may still alternatively comprise an $(Al_eGa_{1-e})_fIn_{1-f}P$ ($0 \leq e \leq 1$, $0.5 < f \leq 1$) cladding layer, and a relaxation buffer layer composed of $GaAs_kP_{1-k}$ ($0 \leq k \leq 1$). The relaxation buffer layer is disposed to have a composition graded region, in which k is graded such that the lattice constant of the composition graded region is correspondingly graded from that of the substrate to that of the cladding layer or the light guide. Since the uppermost region of the relaxation buffer layer has a composition which corresponds to the lattice constant matched to that of the cladding layer or light guide, it is possible to relax the lattice strain even if an $(Al_xGa_{1-x})_yIn_{1-y}N_zP_{1-z}$ ($0 \leq x \leq 1$, $0 \leq y \leq 1$, $0 < z < 1$) active layer is used.

Also as above-mentioned, the semiconductor light emitting device still further comprises a light guide, a cladding layer and a relaxation buffer layer.

The light guide is composed of $(Al_eGa_{1-e})_fIn_{1-f}P$ ($0 \leq e < 1$, $0.5 < f \leq 1$), which is lattice-matched to the uppermost region of the relaxation buffer layer, and the cladding layer is composed of $(Al_sGa_{1-s})_tIn_{1-t}P$ ($e < s \leq 1$, $t = f$), which is also lattice-matched to the uppermost region of the relaxation buffer layer.

Therefore, it is possible to fabricate a SCH structure even if an $(Al_xGa_{1-x})_yIn_{1-y}N_zP_{1-z}$ ($0 \leq x \leq 1$, $0 \leq y \leq 1$, $0 < z < 1$) active layer is used, which has a lattice constant larger than that of GaP, and smaller than that of GaAs.

Alternatively, the active layer of the III–V alloy semiconductor of the light emitting device may be fabricated on a $GaAs_kP_{1-k}$ ($0 < k < 1$).

The active layer may also be disposed so as not to be completely lattice-matched to the $GaAs_kP_{1-k}$ substrate, but of a thickness of less than the critical thickness, enough to obviate the occurrence of misfit dislocations.

Therefore, it is possible to relax the lattice strain even if an $(Al_xGa_{1-x})_yIn_{1-y}N_zP_{1-z}$ ($0 \leq x \leq 1$, $0 \leq y \leq 1$, $0 < z < 1$) active layer is used in the present invention, which has a lattice constant larger than that of GaP, and smaller than that of GaAs.

Referring now to the drawings, the following examples are provided further to illustrate preferred embodiments of the present invention.

A plurality of layers of nitrogen-containing III–V alloy semiconductor materials $(Al_xGa_{1-x})_yIn_{1-y}N_zP_{1-z}$ ($0 \leq x \leq 1$, $0 \leq y \leq 1$, $0 < z < 1$) were disposed and measurements were carried out to characterize the materials.

Namely, the semiconductor materials were disposed with MOCVD or MBE. During the growth, nitrogen containing compounds were introduced into a reaction chamber, such as dimethylhydrazine and tertiary butyl amine, together with other source materials.

Since the alloy semiconductor materials containing phosphorous are generally known to desorb phosphorous from the material surface during the epitaxial growth, MOCVD may be preferably used as a growth method, in which phosphorus pressures can be increased during the growths.

In addition, although the use of $NH_3$ may first be considered as a nitrogen source material, it is avoided because of its relatively low dissociation rate. The use of monomethylhydrazine has also been considered. However, it was found to require a large amount of carrier gas because it has a low vapor pressure.

Therefore, as above-mentioned, dimethylhydrazine (DMHy) or tertiary butyl amine (TBA), which have relatively high vapor pressures, were used as the nitrogen source material.

Figure 3:
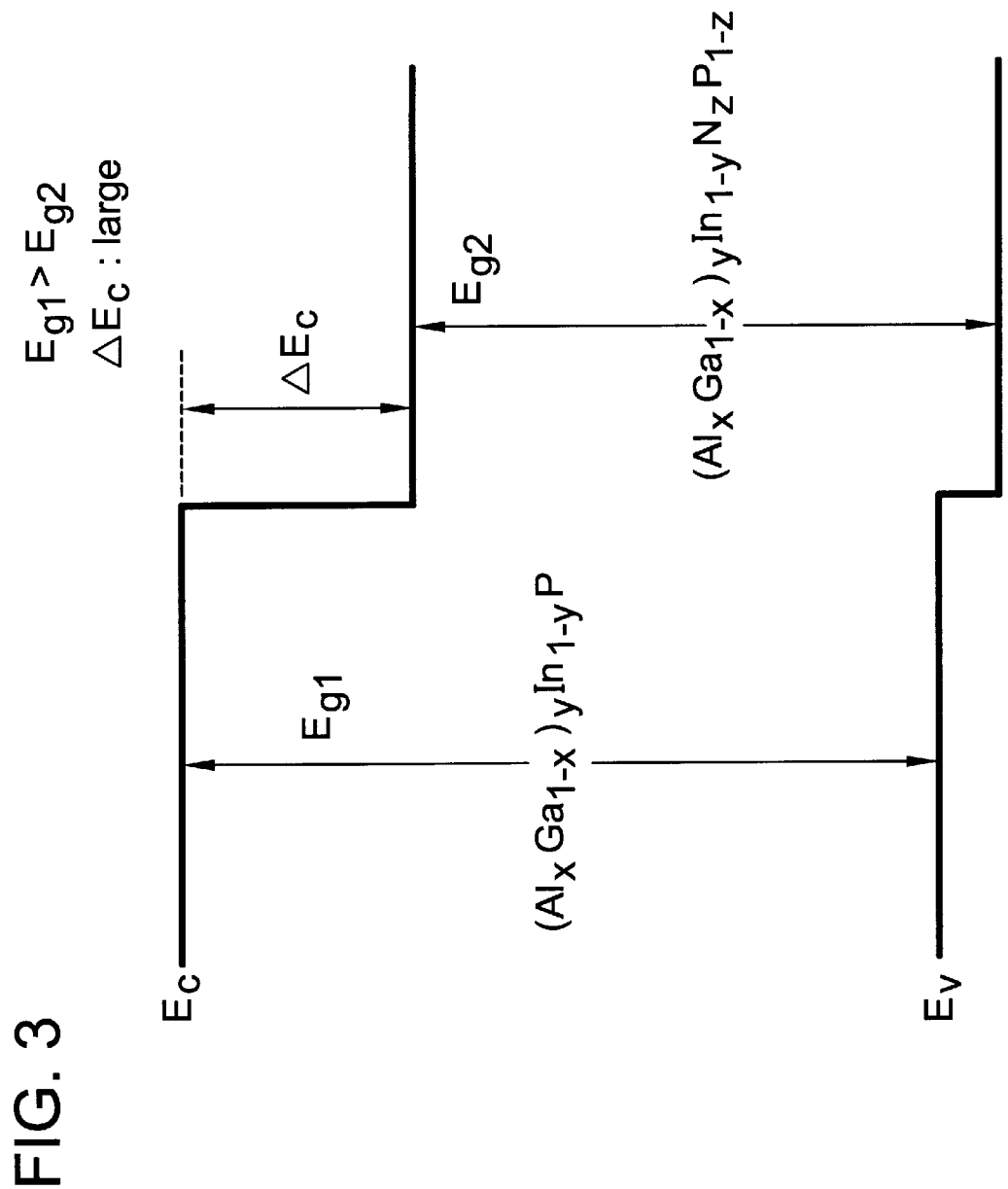
FIG. 3 shows an energy band alignment for a heterojunction formed by $(Al_xGa_{1-x})_yIn_{1-y}P$ and a nitrogen added material $(Al_xGa_{1-x})_yIn_{1-y}N_zP_{1-z}$.

Referring to the drawings, FIG. 3 represents an energy band alignment of a heterostructure which is formed with two alloy semiconductors, $(Al_xGa_{1-x})_yIn_{1-y}P$ and $(Al_xGa_{1-x})_yIn_{1-y}N_zP$ which is $(Al_xGa_{1-x})_yIn_{1-y}P$ added with nitrogen.

It is described by Kondow, in Oyo Buturi, Vol. 65(2), 1996, pages 148–151, that, by adding several percent of nitrogen into a conventional III–V alloy semiconductor such as $(Al_xGa_{1-x})_yIn_{1-y}P$, the band gap energy decreases as shown by the relationship $E_{g1} > E_{g2}$ in FIG. 3, where $E_{g1}$ and $E_{g2}$ are band gap energies of the semiconductor before and after the nitrogen addition, respectively. FIG. 3 also shows that a conduction band energy and a valence band energy of the nitrogen added semiconductor also decrease.

Namely, in a heterostructure consisting of an $(Al_xGa_{1-x})_yIn_{1-y}P_{1-z}$ cladding layer and an $(Al_xGa_{1-x})_yIn_{1-y}N_zP_{1-z}$ active layer, the valence band energy of the cladding layer is higher than that of the active layer. Therefore, hole carriers can not be confined into the active layer, indicating that this material can not be used for light emitting devices.

However, attention in the present invention has been focused on the fact that a large conduction band discontinuity ($\Delta Ec$) exists in the heterostructure with the $(Al_xGa_{1-x})_yIn_{1-y}P_{1-z}$ cladding layer and the $(Al_xGa_{1-x})_yIn_{1-y}N_zP_{1-z}$ active layer, and that the confinement of even hole carriers becomes feasible by appropriately selecting the materials and composition, for the active layer and cladding layer. In addition, since $(Al_xGa_{1-x})_yIn_{1-y}N_zP_{1-z}$ is an alloy material composed of $(Al_xGa_{1-x})_yIn_{1-y}P$ and $(Al_xGa_{1-x})_yIn_{1-y}N$, the lattice constant of $(Al_xGa_{1-x})_yIn_{1-x}N_zP_{1-x}$ decreases with the increase in nitrogen content.

Figure 4:
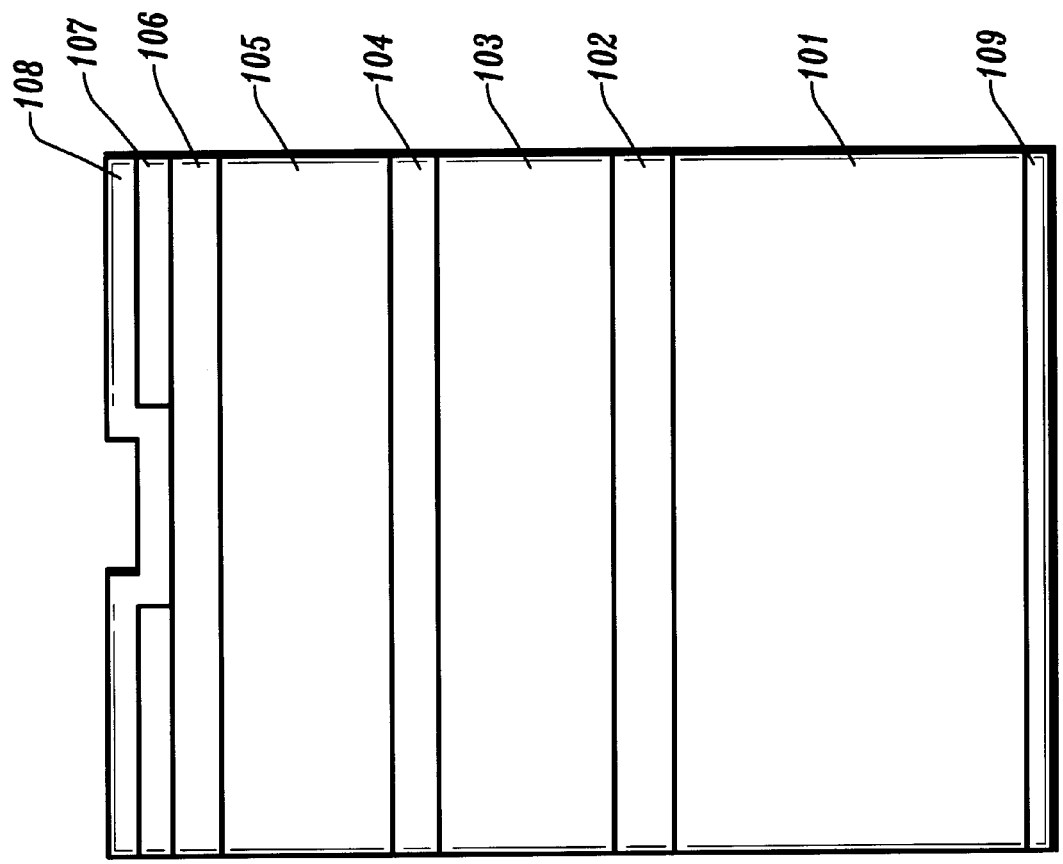
FIG. 4 is a cross sectional view of a light emitting device in accordance with a first embodiment of the present invention.

FIG. 4 represents a first embodiment of the semiconductor light emitting device of the invention.

The light emitting device comprises an active or light emitting layer composed of a nitrogen-containing III–V alloy semiconductor $(Al_xGa_{1-x})_yIn_{1-y}N_zP_{1-z}$ ($0 \leq x \leq 1$, $0 \leq y \leq 1, 0 < z < 1$).

The light emitting device was fabricated on an n-GaAs substrate 101, for which the direction normal to the surface of the substrate was misoriented by 15° from the direction normal to the (100) plane toward the [011] direction.

On the GaAs substrate, there disposed with MOCVD, are an n-GaAs buffer layer 102, an n-$(Al_{0.7}Ga_{0.3})_{0.51}In_{0.49}P$ cladding layer 103, an $(Al_{0.2}Ga_{0.8})_{0.49}In_{0.51}N_{0.01}P_{0.99}$ active layer 104, a p-$(Al_{0.7}Ga_{0.3})_{0.51}In_{0.49}P$ cladding layer 105, and a p-GaAs contact layer 106.

The present light emitting device operates as a laser diode of a double-hetero (DH) structure formed with the cladding layers 103 and 105, and the active layer 104. When these layers have the above-mentioned compositions, they are lattice-matched to the GaAs substrate 101.

As illustrated in FIG. 4, the light emitting device 106 was further provided with a $SiO_2$ dielectric layer 107, a positive electrode 108 on top of the device and a AuGe-Ni-Au negative electrode 109 on the back side of the device.

Although the light emitting device of FIG. 4 has a dielectric-stripe structure, the device may also be fabricated in other types of device structures.

FIGS. 5a and 5b represent energy band alignments for the cladding layer and the active layer of the light emitting device of FIG. 4. FIGS. 5a and 5b illustrate an active layer consisting $(Al_{0.2}Ga_{0.8})_{0.49}In_{0.51}P$ (i.e., without nitrogen addition), and $(Al_{0.2}Ga_{0.8})_{0.49}In_{0.51}N_{0.01}P_{0.99}$ (i.e., with nitrogen), respectively.

In those structures of FIGS. 5a and 5b, In contents were 0.49 and 0.51 for the cladding layer and the active layer, respectively, because of the following reason:

As above-described, the lattice constant of the active layer decreases with increases in the nitrogen content in the layer. To compensate the lattice shrinkage and to retain the active layer to be lattice-matched to the GaAs substrate, it was necessary to slightly increase the content of, for example, In which had the covalent radius larger than that of nitrogen.

Without nitrogen addition, the band gap energy of the $(Al_{0.7}Ga_{0.3})_{0.51}In_{0.49}P$ cladding layer is larger than that of the $(Al_{0.2}Ga_{0.8})_{0.49}In_{0.51}P$ active layer, as illustrated in FIG. 5a. By the nitrogen addition, as illustrated in FIG. 5b, the band gap energy of the active layer decreases ($E_{g1} > E_{g2}$), and the conduction band offset increases ($\Delta Ec_1 < \Delta Ec_2$).

Therefore, by using $(Al_{0.2}Ga_{0.8})_{0.49}In_{0.51}N_{0.01}P_{0.99}$ as the active layer, a device which has a large conduction band offset was able to be fabricated, and which results in observed light emissions at 650 nm. This is the same wavelength as that from a device which has a $Ga_{0.51}In_{0.49}P$ active layer, and which is lattice-matched to GaAs.

As described just above, if a material is appropriately selected so as (1) to have a band gap energy larger than that of corresponding emission wavelengths, (2) to have a lattice constant larger than that of the selected material, and (3) to possibly be added with nitrogen to adjust the lattice constant, a light emitting device can be fabricated with the material which is lattice-matched to GaAs and which has light emissions of predetermined wavelengths.

Figure 6:
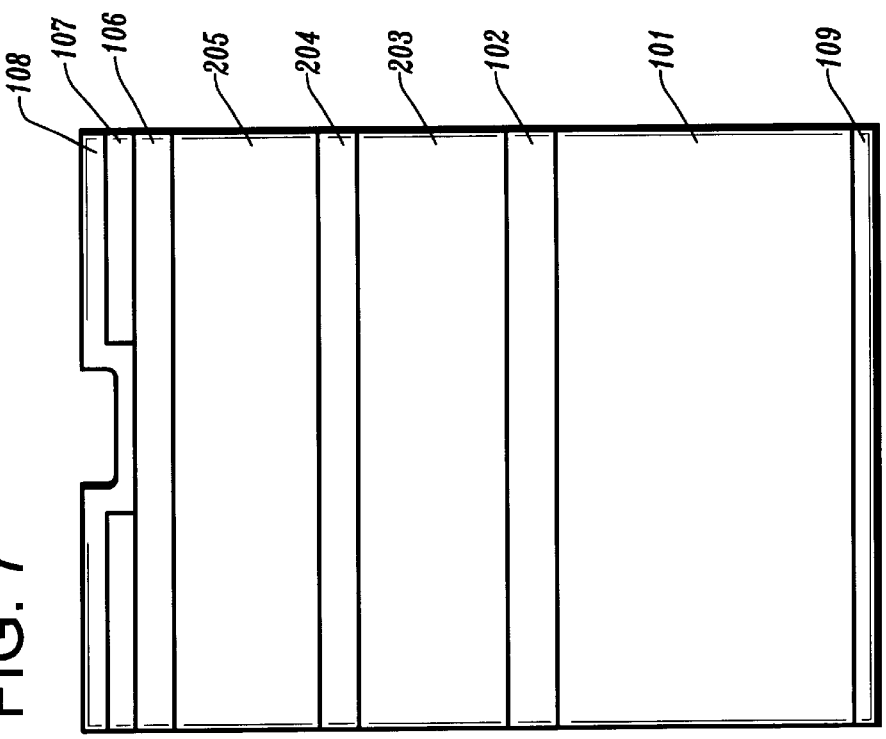
FIG. 6 shows an energy band alignment for a heterojunction formed with an $(Al_{0.7}Ga_{0.3})_{0.51}In_{0.49}P$ cladding layer and a $Ga_{0.51}In_{0.49}P$ active layer of a conventional light emitting device.

FIG. 6 represents an energy band alignment for a conventional general device structure consisting of an $(Al_{0.7}Ga_{0.3})_{0.51}In_{0.49}P$ cladding layer and a $Ga_{0.51}In_{0.49}P$ active layer. In that structure, $\Delta Ec$ is about 189 meV and $\Delta Ev$ is about 224 meV. By contrast, since $\Delta Ec$ becomes considerably larger than 189 meV in the device of FIG. 4, its temperature dependency of the threshold current density on the temperature can be reduced to be less than conventional devices.

In addition, as illustrated in FIG. 6, $\Delta Ev$ is much larger than the value generally required to confine hole carriers. Therefore, by selecting appropriate compositions, it may be feasible to decrease $\Delta Ev$ by a certain amount and then increase $\Delta Ec$ by that amount, resulting in an increase in $\Delta Ec$ to 350 meV or larger. However, in this case, it is still necessary to select the material and/or composition after the nitrogen addition, such that $\Delta Ev$ is large enough (about 60 meV or larger) to confine hole carriers.

As described above, according to the present invention, a light emitting device was obtained, which had improved temperature characteristics over previous conventional devices which consisted of AlGaInP materials.

Conventional light emitting diodes are known, which consists of GaP or GaAsP, and which are doped with nitrogen to a concentration of about $3 \times 10^{19}$ cm$^{-3}$ or less to improve the light emitting efficiency. By contrast, by adding nitrogen of equal to, or larger than $3 \times 10^{19}$ cm$^{-3}$ (i.e., 0.13% or greater in atomic ratio) in the present invention, it is intended to decrease its band gap energy, as well as the conduction band and the valence band energies.

As aforementioned, there was used in an active layer of the present invention, $(Al_xGa_{1-x})_yIn_{1-y}N_zP_{1-z}$ ($0 \leq x \leq 1$, $0 \leq y \leq 1, 0 < z < 1$), such as, for example, $(Al_{0.2}Ga_{0.3})_{0.49}In_{0.51}N_{0.01}P_{0.99}$, which included nitrogen as a group V element. However, the composition of the active layer material was varied where relevant. For example, the element As may be included as the group V element. However, since this As addition was found to increase emission wavelengths, the above-mentioned $(Al_xGa_{1-x})_yIn_{1-y}N_zP_{1-z}$ ($0 \leq x \leq 1, 0 \leq y \leq 1, 0 < z < 1$) was preferably utilized.

Although the light emitting device (or laser diode in the present case) of FIG. 4 had a conventional DH structure, other structures may also be employed, such as, for example, an active layer composed of a multiquantum well (MQW) structure, incorporating a light guide of $(Al_aGa_{1-a})_bIn_{1-b}N_cP_{1-c}$ ($0 \leq a \leq 1, 0 < b < 1, 0 \leq c < 1$) which is disposed between the active layer and a cladding layer of $(Al_hGa_{1-h})_{0.51}In_{0.49}P$ ($0 < h \leq 1$), and which has a band gap energy larger than that of the active layer and smaller than that of the cladding layer.

In addition, a GaAs substrate was selected such that the direction normal to the surface of the substrate was misoriented by 15° from the direction normal to the (100) plane toward the [011] direction in the above-mentioned example. However, a GaAs substrate may also be used such that the direction normal to the surface of the substrate is misoriented from the direction normal to the (100) plane toward the [011] direction by an angle of from −54.7° to 54.7°, or toward the [0−1 1] direction by an angle of from −54.7° to −10° or from 10° to 54.7°

For this substrate orientation, it is possible to prevent the natural growth of superlattice structures in overlying layers, thereby preventing an undue decrease in the band gap energy of the active layer, and facilitating light emission of shorter wavelengths.

Although the material for the active layer of the present embodiment was selected to have the same lattice constant as that of the GaAs substrate, an active layer material which has strains may also be used, as long as the thickness of the active layer is smaller than the critical thickness for the appearance of the misfit dislocations.

In addition, although the cladding layers 103 and 105 of FIG. 4, were composed of $(Al_{0.7}Ga_{0.3})_{0.51}In_{0.49}P$ which is lattice-matched to GaAs, $Al_{0.51}In_{0.49}P$ may also be used for these cladding layers.

Figure 7:
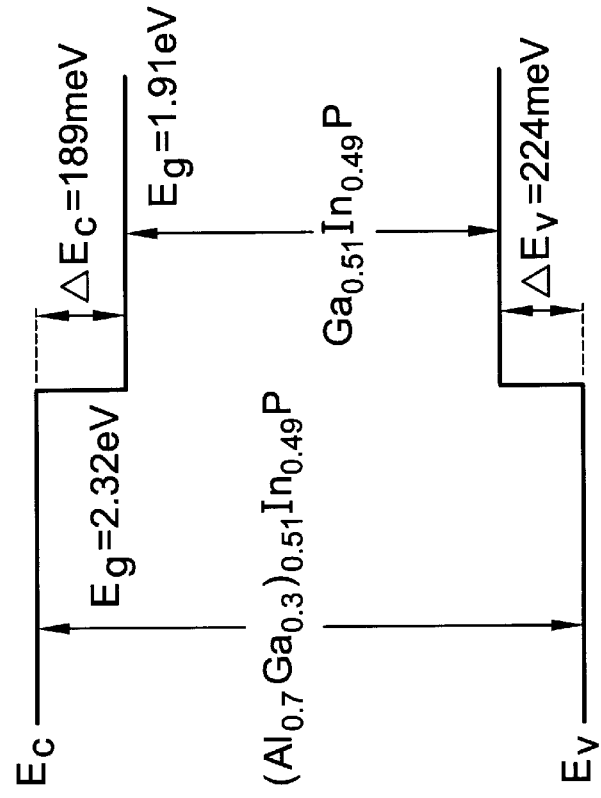
FIG. 7 is a cross section of a light emitting device in accordance with a second embodiment of the present invention.

FIG. 7 represents a second embodiment of a semiconductor light emitting device of the present invention. By contrast with the $(Al_{0.7}Ga_{0.3})_{0.51}In_{0.49}P$ cladding layers of the device (or laser diode) of FIG. 4, $Al_{0.51}In_{0.49}P$ which is lattice-matched to GaAs substrate, was used as the cladding layers 203 and 205. Also, $(Al_{0.5}Ga_{0.5})_{0.49}In_{0.51}N_{0.01}P_{0.99}$ was used for an active layer, which was also lattice-matched to GaAs substrate.

FIGS. 8a and 8b represent energy band alignments for heterostructures with the cladding layer and the active layers of the light emitting device of FIG. 7. FIGS. 8a and 8b illustrate an active layer composed of $(Al_{0.5}Ga_{0.5})_{0.49}In_{0.51}P$ (i.e., without nitrogen addition), and $(Al_{0.5}Ga_{0.5})_{0.49}In_{0.51}N_{0.01}P_{0.99}$ (i.e., with nitrogen), respectively.

FIG. 8a indicates that before the nitrogen addition, the band energy of the conduction band is higher than that the cladding layer, that is, $\Delta Ec$ is negative. By contrast, after the nitrogen addition, the band gap energy decreases (i.e., $E_{g1}>E_{g2}$), and the conduction band and valence band energies also decrease as indicated in FIG. 8b. Namely, the conduction band energy of the active layer becomes lower than that of the cladding layer, resulting in presently observed light emissions at 600 nm from the light emitting device.

$(Al_aGa_{1-a})_{0.51}In_{0.49}P$ ($0 \leq a < 1$) is conventionally used for the active layer. Among the compositions of $(Al_hGa_{1-h})_{0.51}In_{0.49}P$ ($a < h \leq 1$) used as the cladding layer material, materials with h=0.7 was preferably used, because of the following reason:

Although, the above material becomes an indirect transition semiconductor and has a small conduction band offset $\Delta Ec$ with h>0.7, it has a maximum $\Delta Ec$ for h=0.7.

However, for the material of the present invention, by adding nitrogen, its band gap energy becomes smaller, while $\Delta Ec$ becomes larger and $\Delta Ev$ smaller. Therefore, by selecting an appropriate material and by carrying out the nitrogen addition, it is possible to form a heterojunction which has an arbitrary magnitude of band offsets. Accordingly, a material having small $\Delta Ec$ and large $\Delta Ev$ is preferred as a starting material for the nitrogen addition.

For example, the conduction band energy of GaInP becomes larger and $\Delta Ec$ becomes smaller by adding Ga. In addition, for AlInP with an Al content of 0.51 or larger, its conduction band energy is larger than that of $Al_{0.51}In_{0.49}P$. Accordingly, by alloying these two materials and adding nitrogen, it is possible to form a heterojunction with an arbitrary magnitude of band offsets.

Accordingly, $Al_{0.51}In_{0.49}P$ which has a large band gap energy is preferably employed as a cladding layer material. However, it is still necessary to select a material and/or composition such that $\Delta Ev$ large enough (about 60 meV) to confine hole carriers can be achieved after the nitrogen addition.

Figure 9:
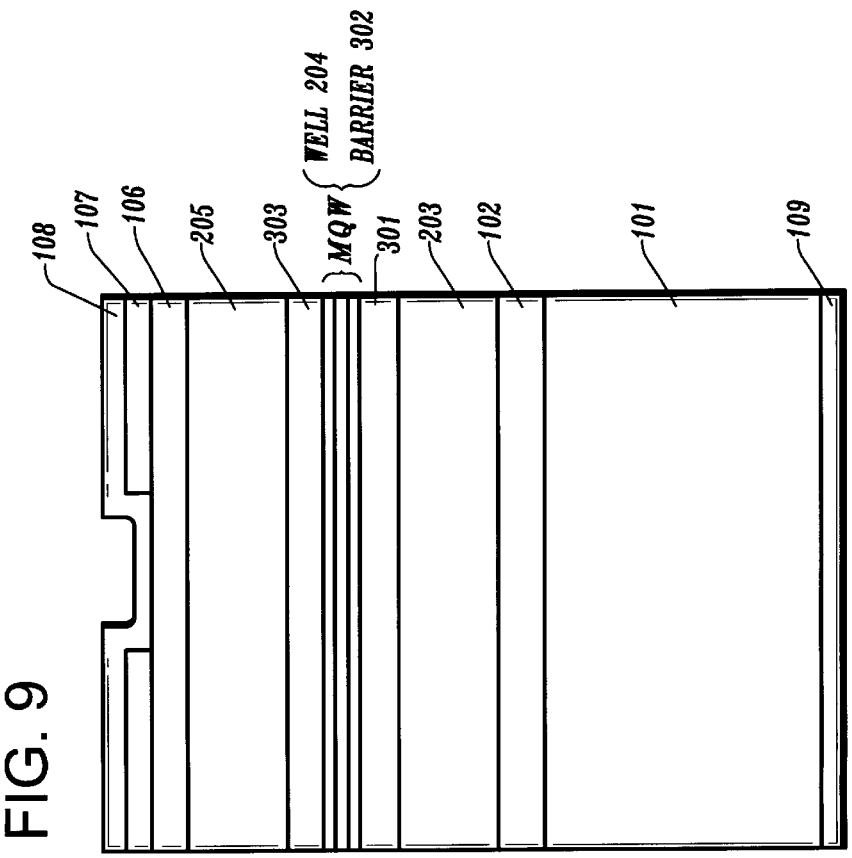
FIG. 9 is a cross sectional view of a light emitting device in accordance with a third embodiment of the present invention.

FIG. 9 represents a third embodiment of the semiconductor light emitting device of the present invention.

By contrast with the $Al_{0.51}In_{0.49}P$ cladding layers of FIG. 4, guide layers 301 and 303 and a barrier layer 302 of $(Al_xGa_{1-x})_yIn_{1-y}N_zP_{1-z}$ ($0 \leq x \leq 1$, $0 \leq y \leq 1$, and $0 < z < 1$) which is lattice-matched to GaAs substrate were employed. In addition, an active layer was composed of a multiquantum well structure 204, which included 10 wells and has a thickness of about 3 nm.

In the present device, the band gap energy of the guide layer is larger than that of the active layer, and smaller than that of the cladding layer, resulting in presently observed light emissions at 560 nm from the light emitting device of FIG. 9.

As the aforementioned embodiment, by using an active layer even having a large band gap energy, it is possible to decrease $\Delta Ev$ by a certain amount and increase $\Delta Ec$ by that amount. As a result, laser diodes are feasible, having light emission wavelengths of 600 nm or shorter at room temperature, which has not been attained with conventional laser diodes previously.

For example, there is described a pulse laser emission at 608 nm at room temperature by Kishino al. in 1991 Spring National Convention Record, the Institute of Electronics, Information and Communication Engineers, GC-1, page 437 of part 4, March 1991. This laser emission is with a laser diode composed of an $Al_{0.5}In_{0.5}P$ barrier and a $Ga_{0.5}In_{0.5}P$ multiquantum well structure incorporating mutiquantum barriers, having $\Delta Ec$ of 120 meV and $\Delta Ev$ of 320 meV.

According to the present invention, by using a laser diode which is composed of an $Al_{0.5}In_{0.5}P$ barrier and $(Al_xGa_{1-x})_yIn_{1-y}N_zP_{1-z}$ ($0 \leq x \leq 1, 0 \leq y \leq 1$, and $0 < z < 1$) wells, and which has $\Delta Ev$ of 60 meV and $\Delta Ec$ of 120 meV, laser emission wavelengths down to about 540 nm can be achieved.

Figure 10:
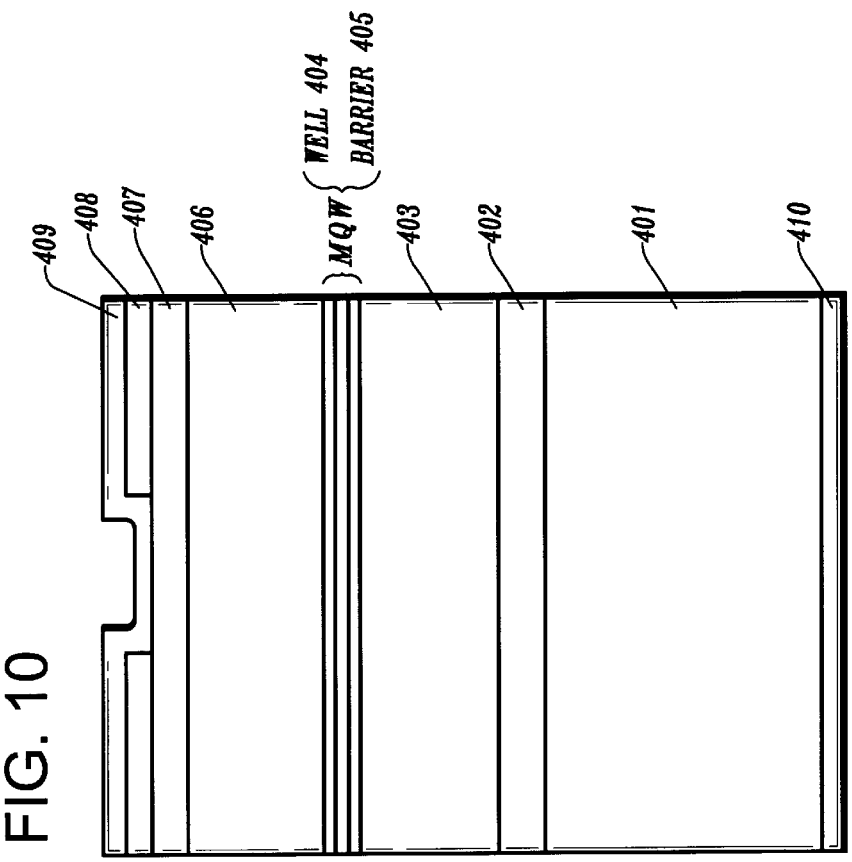
FIG. 10 is a cross sectional view of a light emitting device in accordance with a fourth embodiment of the present invention.

FIG. 10 represents a third embodiment of the semiconductor light emitting device of the invention. The device consists of a GaP substrate 401, cladding layers 403 and 406, and a 0.2-nm-thick barrier layer, both of which were composed of $Al_{0.5}In_{0.5}P$, and a 0.3-nm-thick $Ga_{0.7}In_{0.3}N_{0.01}P_{0.99}$ multiquantum well 404, which consists of 10 wells and has a compressive strain of about 2.1%.

In FIG. 10, the emitting device was further provided with an n-GaP buffer layer 402, a GaP contact layer 407, a $SiO_2$ dielectric layer 408, a positive electrode 409 on top of the device, and a negative electrode 410 on the back side of the device.

Although the light emitting device of FIG. 10 has a dielectric-stripe structure, the device may also fabricated in other types of device structures.

FIGS. 11a and 11b represent energy band alignments for the cladding layer and the active layer of the light emitting device of FIG. 10. FIGS. 11a and 11b illustrate an active layer consisting of a $Ga_{0.7}In_{0.3}P$ active layer (i.e., without nitrogen addition), and $Ga_{0.7}In_{0.3}N_{0.01}P_{0.99}$ (i.e., with nitrogen), respectively.

FIG. 11a indicates that, before the nitrogen addition, the band energy of the conduction band is higher than that of the cladding layer, that is, $\Delta Ec$ is negative. By contrast, after the nitrogen addition, the band gap energy decreases (i.e., $E_{g1}>E_{g2}$) and the conduction band energy of the active layer is lower than that of the cladding layer, which achieves the confinement of carriers into the active layer, as shown in FIG. 8b.

With the laser diode of FIG. 10, a laser emission of about 560 nm was observed. In addition, by using $(Al_xGa_{1-x})_yIn_{1-y}P$ ($0 \leq x \leq 1$ and $0 \leq y \leq 1$) added with nitrogen, which has a lattice constant as small as possible, a material of the same band gap energy can be obtained, yet with a few Al content. This is advantageous from the process and characteristic points of view of the material, as aforementioned.

Figure 12:
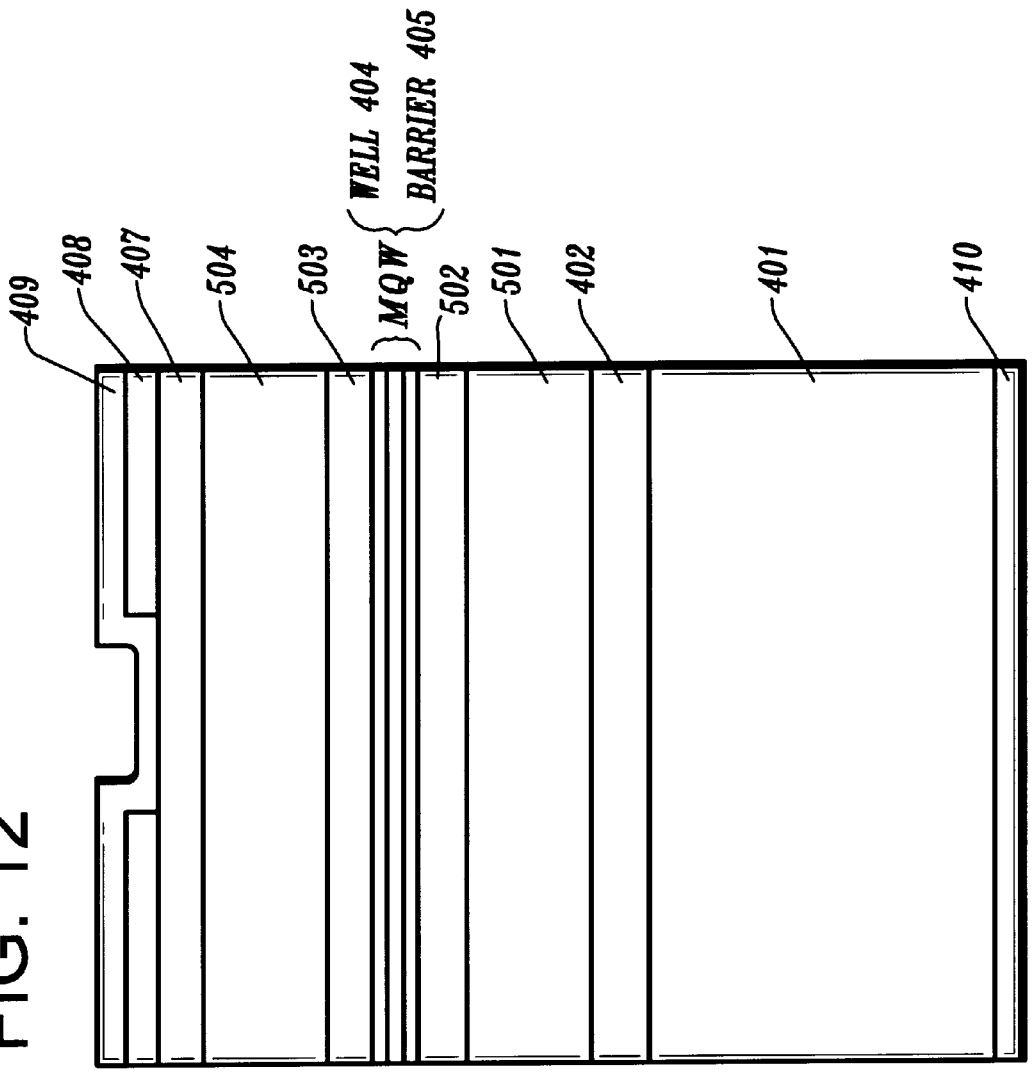
FIG. 12 is a cross sectional view of a light emitting device in accordance with a fifth embodiment of the present invention.

FIG. 12 represents a fifth embodiment of the semiconductor light emitting device of the present invention.

By contrast with the device of FIG. 10, the light emitting device of FIG. 12 is provided with guide layers 502 and 503 and a 0.2-nm-thick barrier layer 405 of $Al_{0.5}Ga_{0.5}P$, a well 404 and a cladding layers 501 and 504 of AlP.

Figure 13:
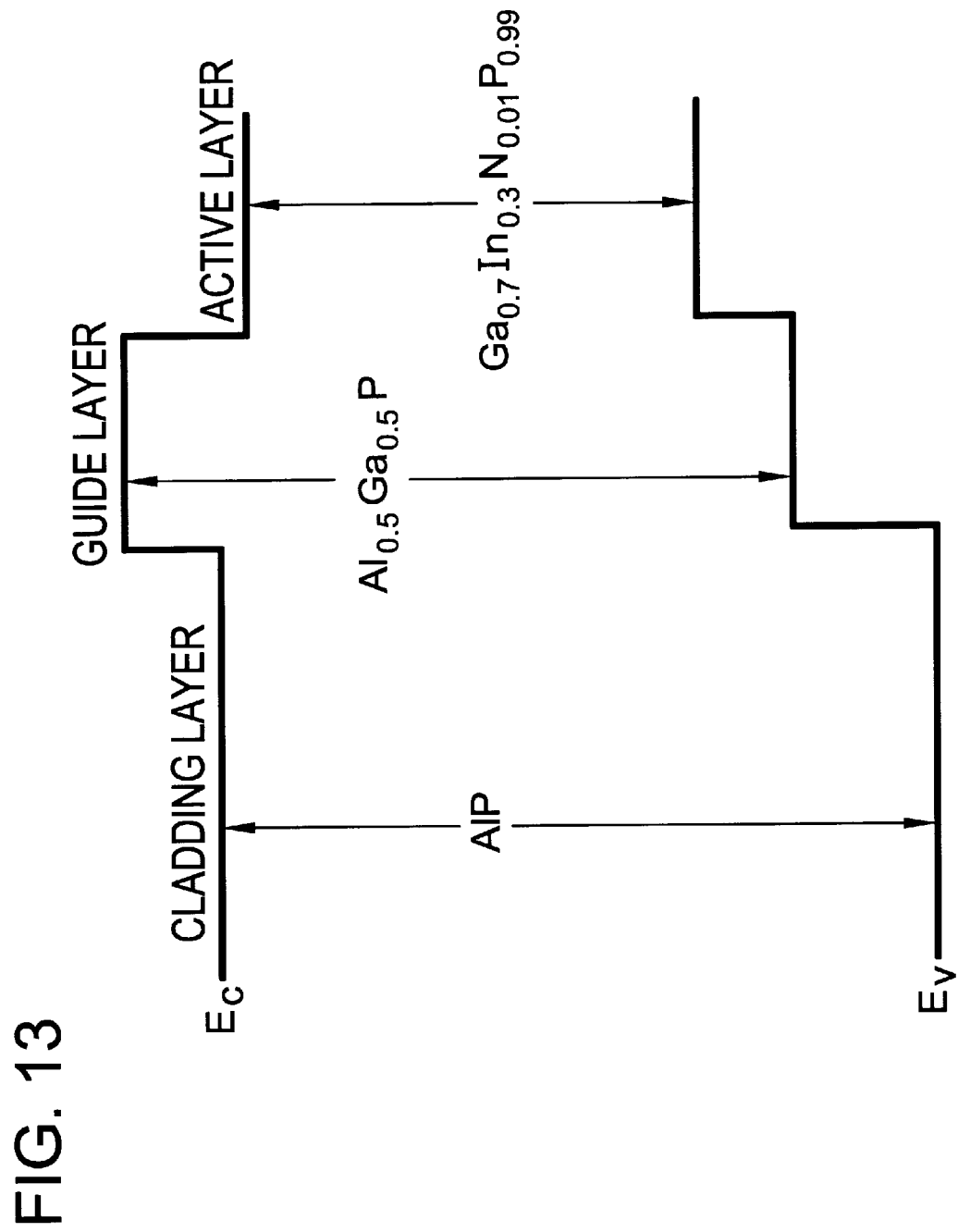
FIG. 13 shows an energy band alignment of the heterojunctions formed with the cladding layer, the guide layer and the active layer of the device of FIG. 12.

FIG. 13 represents an energy band alignment for the heterostructure with the cladding layer and the active layer of the light emitting device of FIG. 12.

FIG. 13 indicates that the conduction band energy of the guide layer is higher than that of the cladding layer. Namely, in the structure of FIG. 12, the carrier (or electron) confinement into the active layer is achieved by a guide layer. In addition, since the refractive index of the AlP cladding layer is smaller than that of the $Al_{0.5}Ga_{0.5}P$ guide layer, the confinement of light was able to be carried out more efficiently than in the structure of FIG. 10, resulting in a smaller threshold current density.

In addition to the above-mentioned layer structure, other structures may also be employed in the invention as long as the light guide layer and the cladding layer are composed of $Al_cGa_{1-c}P$ ($0 \leq c < 1$) and $Al_dGa_{1-d}P$ ($c < d \leq 1$), respectively.

Figure 14:
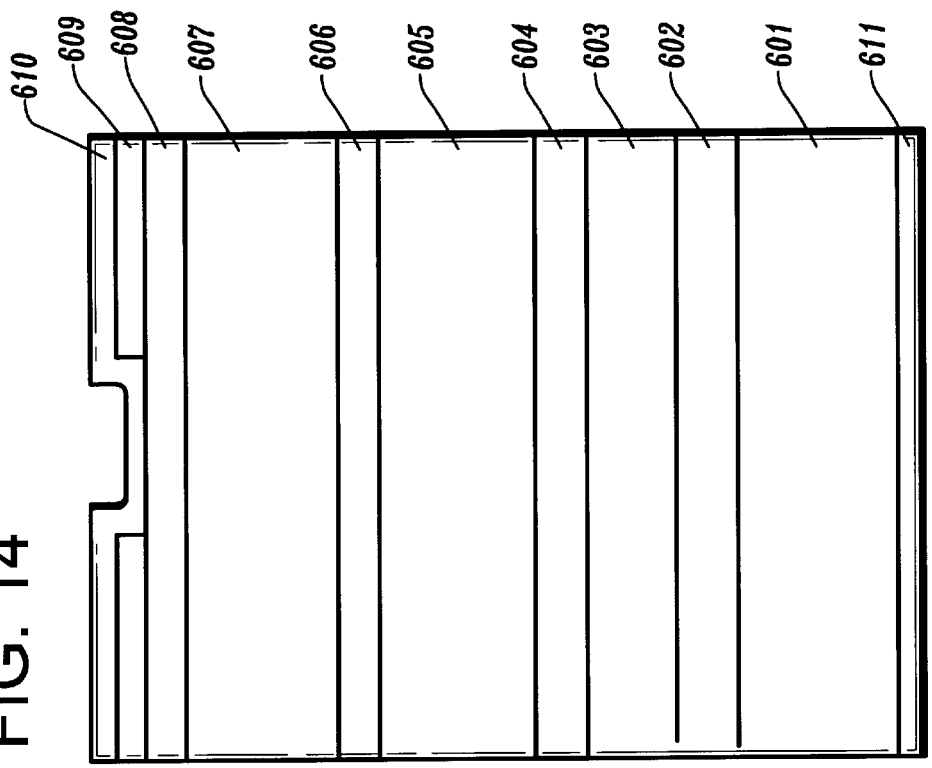
FIG. 14 is a cross sectional view of a light emitting device in accordance with a sixth embodiment of the present invention.

FIG. 14 represents a sixth embodiment of the semiconductor light emitting device of the present invention. The device consists of a GaAs substrate 601, a GaAs$_k$P$_{1-k}$ (0<k<1) lattice relaxation layer, and a DH structure which is composed of (1) an n-Ga$_{0.72}$In$_{0.28}$P$_{0.99}$ buffer layer 604, (2) (Al$_{0.5}$Ga$_{0.5}$)$_{0.72}$In$_{0.28}$P cladding layers 605,607, and (3) a Ga$_{0.7}$In$_{0.3}$N$_{0.01}$P$_{0.99}$ active layer 606.

The above-mentioned GaAs$_k$P$_{1-k}$ (0<k<1) lattice relaxation layer is composed of (1) a portion 602 of the relaxation layer in which k is graded from 0 (at the interface between the substrate) to 0.6, and (2) an overlying portion 603 with k=0.6, which are formed on the GaAs substrate 601 and had an overall layer thickness of about 40 microns.

In the above-mentioned construction, the DH structure was formed on the GaAs$_k$P$_{1-k}$ (k=0.6) portion 603, and the cladding layers 605 and 607, and the active layer 606 were approximately lattice-matched to the GaAs$_{0.6}$P$_{0.4}$ portion 603.

In addition, as shown in FIG. 14, the emitting device was further provided with a GaAs$_{0.6}$P$_{0.4}$ contact layer 608, a SiO$_2$ dielectric layer 609, and a positive electrode 610 on top of the device, and a negative electrode 611 on the back side of the device.

As shown above in the device of FIG. 14, strains caused by a lattice-mismatch between the substrate and the DH structure is relaxed by the relaxation layers 602 and 603, thereby achieving a larger thickness of the active layer, which makes a wider selection possible in designing and processing the devices.

Although the light emitting device of FIG. 14 had a dielectric-stripe structure, the device may also fabricated in other types of device structures.

In addition, although the light emitting device of FIG. 14 included a DH structure, this structure may also be constructed so as to comprise (1) a quantum well active layer and (2) an (Al$_e$Ga$_{1-e}$)$_f$In$_{1-f}$P (e<s≦1, t=f) guide layer which is formed between the active layer and an (Al$_s$Ga$_{1-s}$)$_t$In$_{1-t}$P (0≦s≦1 and 0.5<t≦1) cladding layer and which has a band gap energy smaller than that of the cladding layer and larger than that of the active layer.

Additionally, a GaAs$_k$P$_{1-k}$ (0<k<1) substrate 601 may also used, thereby achieving comparable device characteristics to that with a GaAs substrate. This GaAs$_k$P$_{1-k}$ substrate is formed, for example, by disposing a relatively thick GaAs$_k$P$_{1-k}$ (0<k<1) layer on a GaAs substrate by vapor phase epitaxy (VPE) and subsequently removing the GaAs substrate by a chemical etching method.

Figure 15:
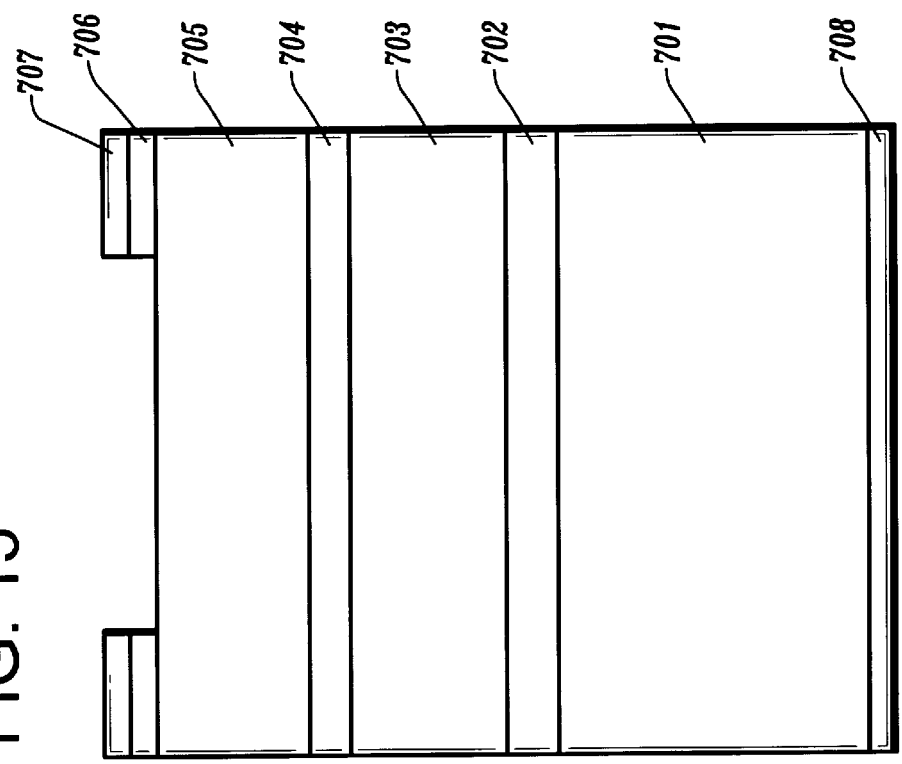
FIG. 15 is a cross sectional view of a light emitting device in accordance of a seventh embodiment of the present invention.

FIG. 15 represents a seventh embodiment of the semiconductor light emitting device of the present invention, wherein the device is a light emitting diode.

The light emitting device of FIG. 15 consists of a GaAs substrate 701, Al$_{0.5}$In$_{0.5}$P cladding layers 703 and 705 which were lattice-matched to the GaAs substrate, an (Al$_{0.6}$Ga$_{0.4}$)$_{0.49}$In$_{0.51}$N$_{0.01}$P$_{0.99}$ active layer 704 which was also lattice-matched to the GaAs substrate, and which was doped with Se as n-type dopants.

In addition, as shown in FIG. 15, the device was further provided with an n-GaAs buffer layer 702, a GaAs contact layer 706, a positive electrode 707 on top of the device, and a negative electrode 608 on the back side of the device.

With the light emitting diode of FIG. 15, light emissions of about 590 nm or yellow light were observed. In addition, the diode had ΔEc larger than conventional diodes and, accordingly, a considerably high light emission efficiency was obtained as a result of the nitrogen addition.

As the n-type dopants, S or Si may also be used in place of Se. Likewise, p-type dopants such as Zn, Mg, C or Be may also be used for the present purpose.

The composition of the active layer may be arbitrary selected depending on color of emitted light. In addition, a quantum well structure may also be used as an active layer such as, for example, the aforementioned structure of FIG. 9, thereby resulting in a light emission of 560 nm (or green).

Figure 16:
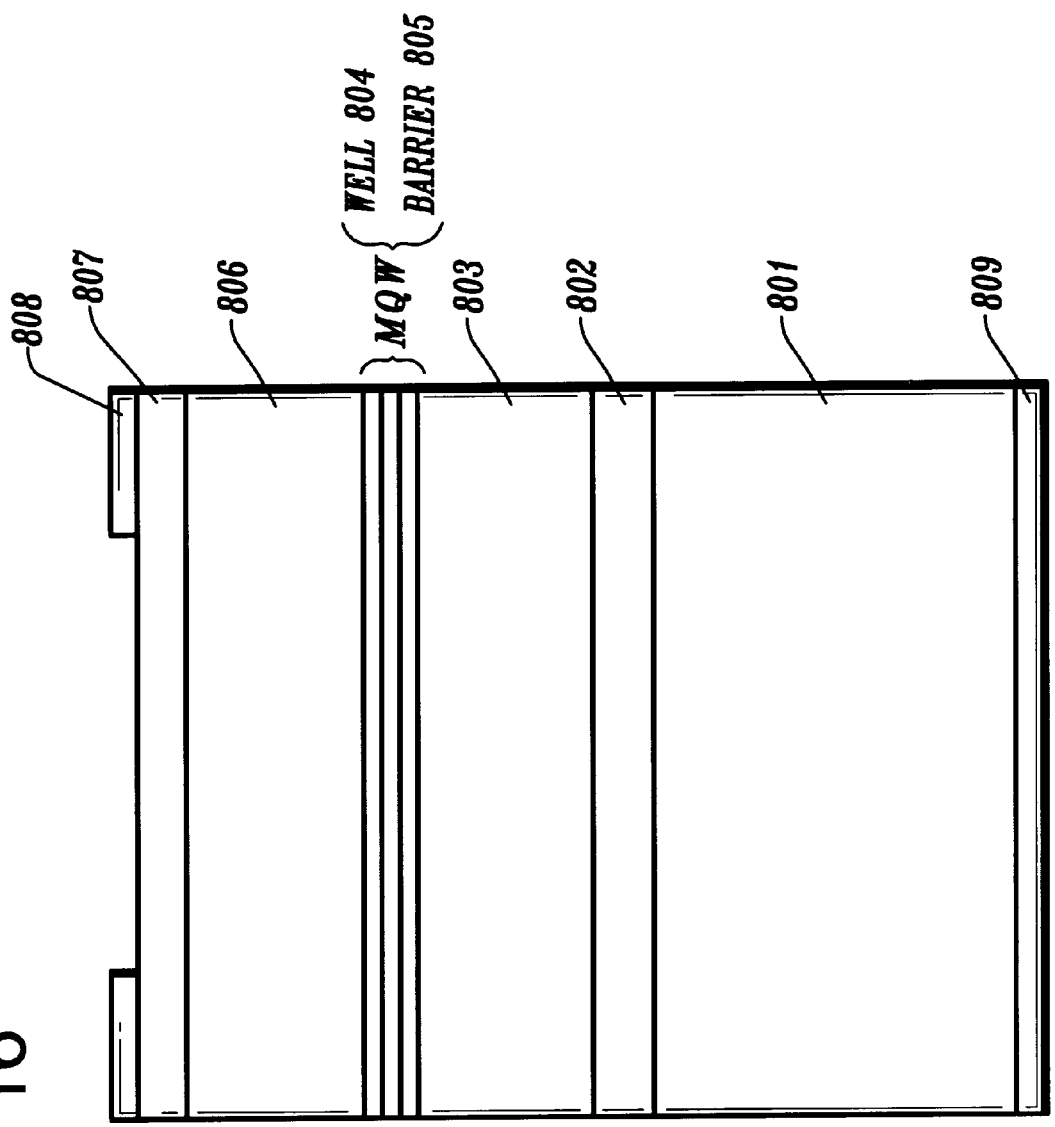
FIG. 16 is a cross sectional view of a light emitting device in accordance with an eighth embodiment of the present invention.

FIG. 16 represents an eighth embodiment of the semiconductor light emitting device of the present invention, wherein the device is a light emitting diode. The device consists of (1) a GaP substrate 801, (2) cladding layers 803 and 806, and a 0.2-nm-thick barrier layer 805, both of which were composed of Al$_{0.5}$Ga$_{0.5}$P, and (3) a 0.3-nm-thick Ga$_{0.75}$In$_{0.25}$N$_{0.01}$P0.99 active layer 804 which was composed of a multiquantum well structure with 10 wells and had a compressive strain of about 1.7%.

In FIG. 16, the emitting device was further provided with an n-GaP buffer layer 802, a GaP contact layer 807, a positive electrode 808 on top of the device, and a negative electrode 809 on the back side of the device.

In the construction of FIG. 16, a multiquantum well structure, having a reduced compressive strain, was formed on a GaP substrate with a direct transition semiconductor material. Since Ga$_{0.75}$In$_{0.25}$N$_{0.01}$P$_{0.99}$ is formed by alloying two materials, (1) Ga$_{0.75}$In$_{0.25}$P which is an indirect transition material and which has a lattice constant larger than that of GaP, and (2) Ga$_{0.75}$In$_{0.25}$N which is a direct transition material and which has a lattice constant smaller than GaP, the lattice constant of Ga$_{0.75}$In$_{0.25}$P decreases after the nitrogen addition.

As aforementioned, a direct transition semiconductor changes from indirect to direct transition by adding nitrogen in Ga$_{0.75}$In$_{0.25}$P. Furthermore, if a semiconductor material is an indirect transition semiconductor and its composition is close to the composition of the above-mentioned change from indirect to direct transition, the indirect transition material is transformed to direct by adding a small amount of nitrogen addition. Indirect transition (Al$_x$Ga$_{1-x}$)$_y$In$_{1-y}$P (0≦x≦1, 0<y≦1) is therefore changed to a direct transition semiconductor by nitrogen addition, thereby achieving the formation of the multiquantum well structure on a GaP substrate of FIG. 16, which is direct transition type and yet has a reduced compressive strain. Furthermore, since the nitrogen addition is carried out into a material which has a Γ-band energy larger than materials conventionally used, light emissions with shorter wavelengths can be expected for the present device.

Although the light emitting device of FIG. 16 was fabricated as a light emitting diode, the device may also be fabricated as a laser diode using the above-mentioned nitrogen added (Al$_x$Ga$_{1-x}$)$_y$In$_{1-y}$P (0≦x≦1,0<y≦1) as an active layer material. This is feasible because the indirect transition material (Al$_x$Ga$_{1-x}$)$_y$In$_{1-y}$P can be transformed to a direct transition semiconductor by nitrogen addition, as above-mentioned.

Furthermore, even if some materials do not change to direct transition by the nitrogen addition, the energy differences are generally expected to decrease between X- or L-band of the indirect transition and Γ-band of the direct transition in these materials. As a result, an increase in the light emitting efficiency of light emitting diodes can be attained using these materials.

The above-mentioned structure can be employed for not only the above-mentioned materials formed on GaP substrates but also (Al$_x$Ga$_{1-x}$)$_y$In$_{1-y}$N$_z$P$_{1-z}$ (0≦x≦1,0<y≦1, 0<z<1) formed on GaAs substrates.

In the light emitting devices of FIGS. 4 through 16, (Al$_x$Ga$_{1-x}$)$_y$In$_{1-y}$N$_z$P$_{1-z}$ (0≦x<1,0≦y<1,0<z<1) was used as an active layer material, and was formed by nitrogen addition to $(Al_xGa_{1-x})_yIn_{1-y}P$ ($0 \leq x \leq 1, 0 \leq y < 1$). Although the band gap energy of $(Al_xGa_{1-x})_yIn_{1-x}P$ decreases by the nitrogen addition, $\Delta Ec$ can be increased and also $\Delta Ev$ can be decreased. Therefore, a heterojunction can be formed with an arbitrary magnitude of the band offset by selecting an appropriate material and/or composition and by carrying out nitrogen addition.

As a result, an overflow of carries can be decreased more effectively and thereby results in improved temperature characteristics of the devices, such as light emitting diodes and laser diodes of the present invention, over conventional devices which are fabricated with active layer materials having nearly the same band gap energies.

In addition, as also illustrated above, even by using an active layer material having a band gap energy larger than those of conventional materials, it is possible to acquire the magnitudes of both $\Delta Ev$ and $\Delta Ec$ necessary to achieve laser oscillations. As a result, laser diodes can be fabricated, which have light emission wavelengths of 600 nm or smaller at room temperature in the present invention.

According to the present invention, therefore, nitrogen-containing III–V alloy semiconductor materials have both a conduction band offset $\Delta Ec$ and a valence band offset $\Delta Ev$ large enough for the practical applications to light emitting devices. The semiconductor materials are capable of providing laser diodes, having an excellent temperature characteristics with emission wavelengths in the red spectral region and of 600 nm or smaller, and high brightness light emitting diodes with emission wavelengths in the visible spectral region.

Additional modifications and variations of the present invention are possible in light of the above teachings. It is therefore to be understood that within the scope of the appended claims, the invention may be practiced otherwise than as specifically described herein.

What is claimed is:

1. A semiconductor light emitting device comprising:
a semiconductor substrate, and at least one active layer of a nitrogen-containing III–V alloy semiconductor disposed thereon, said at least one active layer having the formula:

$(Al_xGa_{1-x})_yIn_{1-y}N_zP_{1-z}$, wherein $0 \leq x \leq 1$, $0 \leq y \leq 1$, and $0 < z < 1$; and
a cladding layer or a light guide of $(Al_aGa_{1-a})_bIn_{1-b}P$ with $0 \leq a \leq 1$ and $0 < b < 1$, which has a band gap energy larger than that of said at least one active layer, and is lattice-matched to GaAs.

2. The semiconductor light emitting device according to claim 1, wherein a nitrogen concentration in said at least one active layer is equal to or greater than about $3 \times 10^{19}$ cm$^{-3}$.

3. A semiconductor light emitting device comprising:
a semiconductor substrate, and at least one active layer of a nitrogen-containing III–V alloy semiconductor disposed thereon, said at least one active layer having the formula:

$(Al_xGa_{1-x})_yIn_{1-y}N_zP_{1-z}$ with $0 \leq x \leq 1$, $0 \leq y \leq 1$, and $0 < z < 1$, wherein a nitrogen concentration in said at least one active layer is equal to or greater than about $3 \times 10^{19}$ cm$^{-3}$; and
a cladding layer or a light guide of $(Al_aGa_{1-a})_bIn_{1-b}P$ with $0 \leq a \leq 1$ and $0 < b < 1$, which has a band gap energy larger than that of said at least one active layer, and is lattice-matched to GaAs.

4. The semiconductor light emitting device according to claim 3, wherein said at least one active layer is disposed epitaxially by MOCVD method using a nitrogen containing organic compound as a source material for nitrogen.

5. The semiconductor light emitting device according to claim 4, wherein said nitrogen containing organic compound is selected from the group consisting of dimethylhydrazine and tertiary butyl amine.

6. A semiconductor light emitting device comprising:
a GaAs substrate, and at least one active layer of a nitrogen-containing III–V alloy semiconductor disposed thereon, said at least one active layer, having the formula:

$(Al_xGa_{1-x})_yIn_{1-y}N_zP_{1-z}$ with $0 \leq x \leq 1$, $0 \leq y \leq 1$, and $0 < z < 1$, the active layer having a nitrogen concentration of equal to or greater more than about $3 \times 10^{19}$ cm$^{-3}$, and having a thickness of less than a critical thickness, sufficient to obviate the occurance of misfit dislocations between said active layer and said GaAs substrate; and
a cladding layer or a light guide of $(Al_aGa_{1-a})_bIn_{1-b}P$ with $0 \leq a \leq 1$ and $0 < b < 1$, which has a band gap energy larger than that of said at least one active layer, and is lattice-matched to GaAs.

7. The semiconductor light emitting device according to claim 6, further comprising a $(Al_eGa_{1-e})_fIn_{1-f}P$ ($0 \leq e \leq 1$, $0.5 < f \leq 1$) cladding layer, which has a lattice constant larger than that of GaP, and smaller than that of GaAs, and a relaxation buffer layer disposed between said cladding layer and said substrate to relax the lattice mismatch.

8. The semiconductor light emitting device according to claim 6, wherein said relaxation buffer layer is composed of $GaAs_kP_{1-k}$ ($0 \leq k \leq 1$), so as to have a composition graded region, in which k is graded such that the lattice constant of said composition graded region is correspondingly graded from that of said substrate to that of said cladding layer or said light guide.

9. The semiconductor light emitting device according to claim 6, further comprising a light guide, a cladding layer and a relaxation buffer layer, wherein said light guide is composed of $(Al_eGa_{1-e})_fIn_{1-f}P$ ($0 \leq e < 1$, $0.5 < f \leq 1$), which is lattice-matched to the uppermost region of said relaxation buffer layer, and said cladding layer is composed of $(Al_sGa_{1-s})_tIn_{1-t}P$ ($e < s \leq 1$, $t=f$), which is also lattice-matched to the uppermost region of said relaxation buffer layer, and said relaxation buffer layer is composed of $GaAs_kP_{1-k}$ ($0 \leq k \leq 1$) so as to have a composition graded region, in which k is graded such that the lattice constant of said composition graded region is graded correspondingly from that of said substrate to that of said cladding layer or said light guide.

10. The semiconductor light emitting device according to claim 6, wherein said at least one active layer is formed by adding nitrogen to an indirect transition semiconductor having the formula:

$(Al_xGa_{1-x})_yIn_{1-y}P$ with $0 \leq x \leq 1$ and $0 < y \leq 1$.

11. The semiconductor light emitting device according to claim 6, wherein said at least one active layer is added with n- or p-type dopants, wherein said dopants are selected from the group consisting of silicon, selenium or sulfur for the n-type, and zinc, carbon, magnesium or beryllium for the p-type dopants.

12. The semiconductor light emitting device according to claim 6, wherein said semiconductor substrate is formed such that the direction normal to the surface of said substrate is misoriented from the direction normal to the (100) plane toward the [011] direction by an angle of from −54.7° to 54.7°, or toward the [0−1 1] direction by an angle of from −54.7° to −10° or from 10° to 54.7°.

13. The semiconductor light emitting device according to claim 6, wherein said at least one active layer is disposed epitaxially by MOCVD using a nitrogen containing organic compound as a source material for nitrogen.

14. The semiconductor light emitting device according to claim 13, wherein said nitrogen containing organic compound is selected from the group consisting of dimethylhydrazine and tertiary butyl amine.

15. A semiconductor light emitting device comprising:

a semiconductor substrate, and at least one active layer of a nitrogen-containing III–V alloy semiconductor disposed thereon, said at least one active layer having the formula:

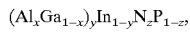

wherein $0 \leq x \leq 1$, $0 \leq y \leq 1$, and $0 < z < 1$;

a light guide of $(Al_aGa_{1-a})_bIn_{1-b}N_cP_{1-c}$, with $0 \leq a \leq 1$, $0 < b < 1$, and $0 \leq c < 1$, which has a band gap energy larger than that of said at least one active layer, and is lattice-matched to GaAs; and a cladding layer of $(Al_hGa_{1-h})_iIn_{1-i}P$, with $0 \leq h \leq 1$ and $0 < i < 1$, which has a band gap energy larger than that of said light guide, and is lattice-matched to GaAs.

16. A semiconductor light emitting device comprising:

a semiconductor substrate, and at least one active layer of a nitrogen-containing III–V alloy semiconductor disposed thereon, said at least one active layer having the formula:

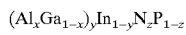

with $0 \leq x \leq 1$, $0 \leq y \leq 1$, and $0 < z < 1$, wherein a nitrogen concentration in said at least one active layer is equal to or greater than about $3 \times 10^{19}$ cm$^{-3}$;

a light guide of $(Al_zGa_{1-a})_bIn_{1-b}N_cP_{1-c}$, with $0 \leq a \leq 1$, $0 < b < 1$, and $0 \leq c < 1$, which has a band gap energy larger than that of said at least one active layer, and is lattice-matched to GaAs; and a cladding layer of $(Al_hGa_{1-h})_iIn_{1-i}P$, with $0 \leq h \leq 1$ and $0 < i < 1$, which has a band gap energy larger than that of said light guide, and is lattice-matched to GaAs.

17. A semiconductor light emitting device comprising:

a GaAs substrate, and at least one active layer of a nitrogen-containing III–V alloy semiconductor disposed thereon, said at least one active layer, having the formula:

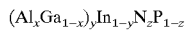

with $0 \leq x \leq 1$, $0 \leq y \leq 1$, and $0 < z < 1$, the active layer having a nitrogen concentration of equal to or greater more than about $3 \times 10^{19}$ cm$^{-3}$, and having a thickness of less than a critical thickness, sufficient to obviate the occurance of misfit dislocations between said active layer and said GaAs substrate;

a light guide of $(Al_aGa_{1-a})_bIn_{1-b}N_cP_{1-c}$, with $0 \leq a \leq 1$, $0 < b < 1$, and $0 \leq c < 1$, which has a band gap energy larger than that of said at least one active layer, and is lattice-matched to GaAs; and a cladding layer of $(Al_hGa_{1-h})_iIn_{1-i}P$, with $0 \leq h \leq 1$ and $0 < i < 1$, which has a band gap energy larger than that of said light guide, and is lattice-matched to GaAs.

18. A semiconductor light emitting device comprising:

a semiconductor substrate, and at least one active layer of a nitrogen-containing III–V alloy semiconductor disposed thereon, said at least one active layer having the formula:

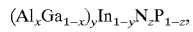

wherein $0 \leq x \leq 1$, $0 \leq y \leq 1$, and $0 < z < 1$; and a cladding layer of $Al_jIn_{1-j}P$, with $0 < j < 1$, which is lattice-matched to GaAs.

19. A semiconductor light emitting device comprising:

a semiconductor substrate, and at least one active layer of a nitrogen-containing III–V alloy semiconductor disposed thereon, said at least one active layer having the formula:

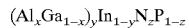

with $0 \leq x \leq 1$, $0 \leq y \leq 1$, and $0 < z < 1$, wherein a nitrogen concentration in said at least one active layer is equal to or greater than about $3 \times 10^{19}$ cm$^{-3}$; and a cladding layer of $Al_jIn_{1-j}P$, with $0 < j < 1$, which is lattice-matched to GaAs.

20. A semiconductor light emitting device comprising:

a GaAs substrate, and at least one active layer of a nitrogen-containing III–V alloy semiconductor disposed thereon, said at least one active layer, having the formula:

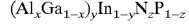

with $0 \leq x \leq 1$, $0 \leq y \leq 1$, and $0 < z < 1$, the active layer having a nitrogen concentration of equal to or greater more than about $3 \times 10^{19}$ cm$^{-3}$, and having a thickness of less than a critical thickness, sufficient to obviate the occurance of misfit dislocations between said active layer and said GaAs substrate; and a cladding layer of $Al_jIn_{1-j}P$, with $0 < j < 1$, which is lattice-matched to GaAs.

21. A laser diode device comprising:

a GaAs substrate, and at least one active layer of a nitrogen-containing III–V alloy semiconductor disposed thereon, said at least one active layer, having the formula:

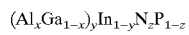

with $0 \leq x \leq 1$, $0 \leq y \leq 1$, and $0 < z < 1$, the active layer having a nitrogen concentration of equal to or greater more than about $3 \times 10^{19}$ cm$^{-3}$, and having a thickness of less than a critical thickness, sufficient to obviate the occurance of misfit dislocations between said active layer and said GaAs substrate.

* * * * *

UNITED STATES PATENT AND TRADEMARK OFFICE
CERTIFICATE OF CORRECTION

PATENT NO. : 6,072,196
DATED : June 6, 2000
INVENTOR(S) : Shunichi Sato

It is certified that error appears in the above-indentified patent and that said Letters Patent is hereby corrected as shown below:

Cover page, item [30], please change "8-25421" to --8-255421--.

Signed and Sealed this

Twentieth Day of March, 2001

Attest:

NICHOLAS P. GODICI

*Attesting Officer*        *Acting Director of the United States Patent and Trademark Office*